(12) United States Patent
Funk et al.

(10) Patent No.: US 12,119,207 B2
(45) Date of Patent: Oct. 15, 2024

(54) APPARATUS FOR PLASMA PROCESSING

(71) Applicant: Tokyo Electron Limited, Tokyo (JP)

(72) Inventors: Merritt Funk, Austin, TX (US); Barton Lane, Austin, TX (US)

(73) Assignee: Tokyo Electron Limited, Tokyo (JP)

( * ) Notice: Subject to any disclaimer, the term of this patent is extended or adjusted under 35 U.S.C. 154(b) by 337 days.

(21) Appl. No.: 17/748,737

(22) Filed: May 19, 2022

(65) Prior Publication Data
US 2023/0377845 A1 Nov. 23, 2023

(51) Int. Cl.
*H01J 37/32* (2006.01)

(52) U.S. Cl.
CPC ..... *H01J 37/3211* (2013.01); *H01J 37/32165* (2013.01); *H01J 37/32183* (2013.01); *H01J 37/32651* (2013.01); *H01J 37/32146* (2013.01); *H01J 2237/327* (2013.01)

(58) Field of Classification Search
CPC ............... H01J 37/321; H01J 37/32174; H01J 37/32192; H01J 37/32247; H01J 37/32082; H01J 37/3211; H01J 37/32311; H01J 2237/327; H01J 37/32183; H01J 37/32091; H01J 37/32146; H01J 37/32165; H01J 37/3222; H01J 37/32651; H05H 1/46; H05H 1/4652; H05H 1/461
See application file for complete search history.

(56) References Cited

U.S. PATENT DOCUMENTS

| | | | |
|---|---|---|---|
| 2003/0192644 A1 | 10/2003 | Pu et al. | |
| 2008/0053615 A1 | 3/2008 | Sago et al. | |
| 2009/0140828 A1 | 6/2009 | Shannon et al. | |
| 2015/0075717 A1* | 3/2015 | Ramaswamy | H01J 37/32183 315/111.21 |
| 2023/0197411 A1* | 6/2023 | Kim | H01J 37/32174 438/798 |

FOREIGN PATENT DOCUMENTS

WO 2015157294 A1 10/2015

OTHER PUBLICATIONS

International Search Report and Written Opinion, International Application No. PCT/US2023/022741, dated Sep. 13, 2023, 8 pages.

* cited by examiner

*Primary Examiner* — Lincoln D Donovan
*Assistant Examiner* — Tyler J Pereny
(74) *Attorney, Agent, or Firm* — Slater Matsil, LLP

(57) ABSTRACT

An apparatus for plasma processing includes a first resonating structure and a second resonating structure. The first resonating structure is coupled to a first RF generator through a first matching circuit. The second resonating structure surrounds the first resonating structure. The second resonating structure is coupled to a second RF generator through a second matching circuit.

20 Claims, 30 Drawing Sheets

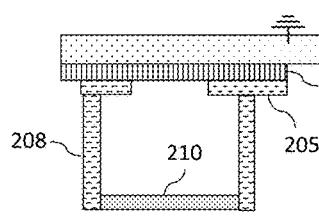
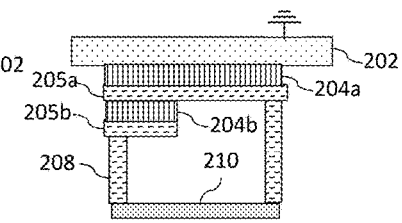
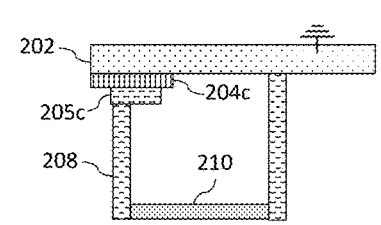
FIG. 2A	FIG. 3A	FIG. 4A
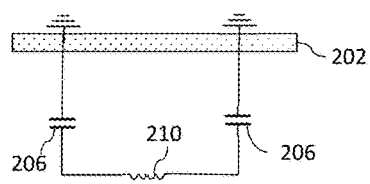
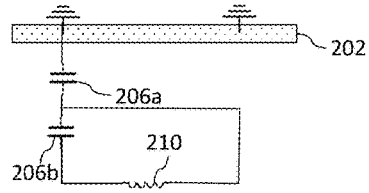
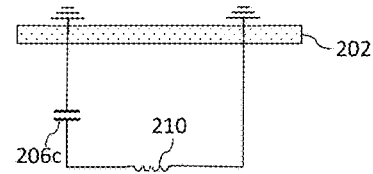
FIG. 2B	FIG. 3B	FIG. 4B

APPARATUS FOR PLASMA PROCESSING

TECHNICAL FIELD

The present disclosure generally relates to semiconductor processing technology and, in particular embodiments, to an apparatus for plasma processing.

BACKGROUND

Plasma processing is extensively used in the manufacturing and fabrication of high-density microscopic circuits within the semiconductor industry.

In a plasma processing system, an electromagnetic wave radiated into a plasma chamber generates an electromagnetic field within the chamber. The generated electromagnetic field heats electrons in the chamber. The heated electrons ignite a plasma that treats the substrate in a process such as for etching, deposit, oxidation, sputtering, or the like.

A non-uniform electromagnetic field within the plasma processing chamber results in a non-uniform treatment of the substrate due to different portions of the substrate being treated with varying densities of plasma. An apparatus and system that allows for the control of the spatial profile of the electromagnetic field and thus the improvement of uniformity of the plasma is desirable.

SUMMARY

In accordance with an embodiment, an apparatus for plasma processing includes: a first resonating structure, the first resonating structure being coupled to a first RF generator through a first matching circuit; and a second resonating structure surrounding the first resonating structure, the second resonating structure being coupled to a second RF generator through a second matching circuit.

In accordance with another embodiment, an apparatus for plasma processing includes: a first resonating structure, the first resonating structure creating a first zone for a first plasma influenced by the first resonating structure; and a second resonating structure, the second resonating structure creating a second zone for a second plasma influenced by the second resonating structure, where the second zone surrounds the first zone.

In accordance with yet another embodiment, an apparatus for plasma processing includes: a first cavity having a first resonant frequency, the first cavity being coupled through a first capacitor to a conductive plane; and a second cavity having a second resonant frequency, the second cavity being surrounded by the first cavity, the second cavity being coupled through a second capacitor to the conductive plane.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present disclosure and the advantages thereof, reference is now made to the following descriptions taken in conjunction with the accompanying drawings, in which:

FIG. 2A is a cross-sectional view of an embodiment resonating structure;

FIG. 2B is a schematic of the embodiment resonating structure of FIG. 2A;

FIG. 3A is a cross-sectional view of an embodiment resonating structure;

FIG. 3B is a schematic of the embodiment resonating structure of FIG. 3A;

FIG. 4A is a cross-sectional view of an embodiment resonating structure;

FIG. 4B is a schematic of the embodiment resonating structure of FIG. 3A;

FIGS. 17-22A are cross-sectional views of detailed examples of embodiment resonating structures;

Figure 1:
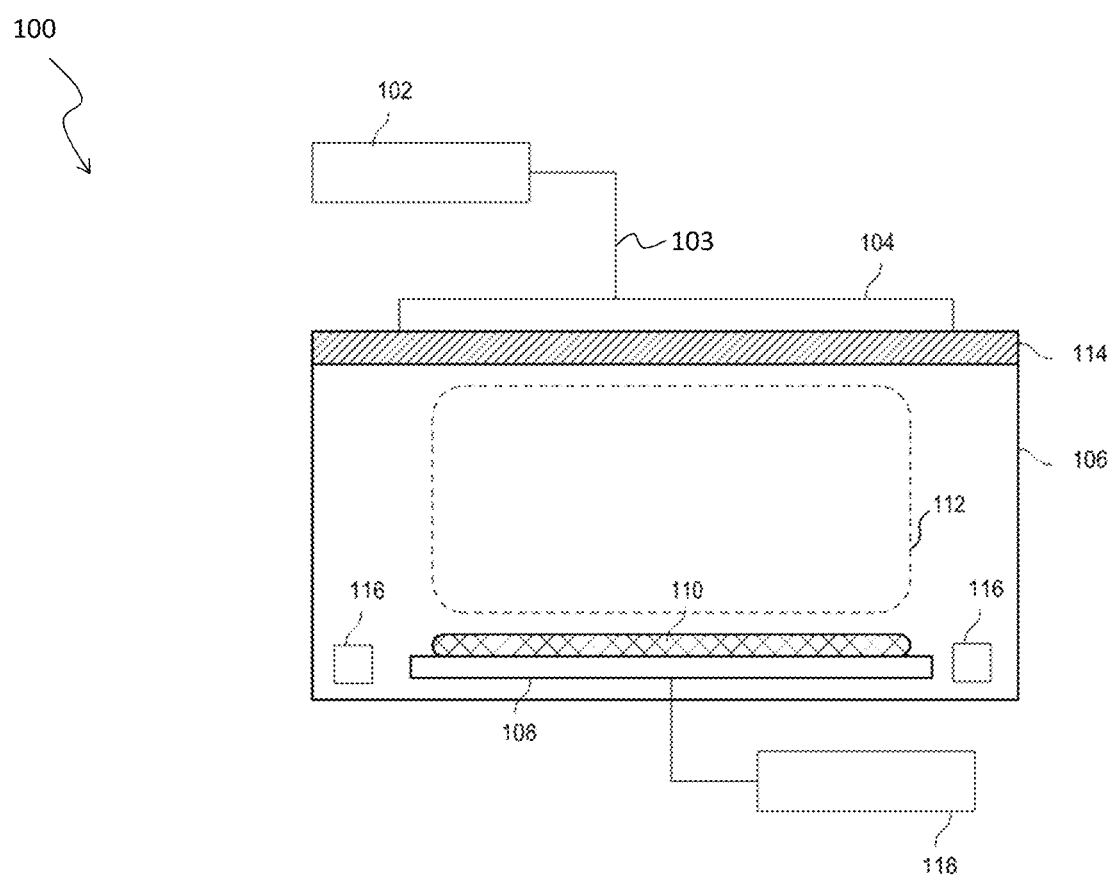
FIG. 1 is a diagram of an embodiment plasma processing system.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments. According to one or more embodiments of the present disclosure, this application relates to multizone resonating structures, where each multizone resonating structure includes more than one component resonating structure.

While inventive aspects are described primarily in the context of resonating structures in a plasma processing system, the inventive aspects may be similarly applicable to fields outside the semiconductor industry. Plasma can be used to treat and modify surface properties through functional group addition. For example, to treat surfaces for paint deposit, plasma can convert hydrophobic surfaces to hydrophilic surfaces. Further, the inventive aspects are not limited to plasma. For example, RF can be used to thaw out frozen food or dry out textiles, food, wood, or the like. In these various examples and across industries, a uniform oscillating magnetic field as disclosed herein is advantageous.

In various embodiments, a reference to magnetic fields refers to magnetic fields oscillating at some frequency, for example, at one of RF or microwave frequencies. In these embodiments, the magnetic fields do not refer to DC magnetic fields. These and other details are discussed in greater detail below.

According to embodiments, multizone resonating structures provide symmetry control and radial uniformity control of generated plasmas, which is useful for the plasma treatment of substrates. A resonant structure may be a conductive structure having one or more resonant electromagnetic frequencies, and the resonant structure may be driven at or near one of its resonant electromagnetic frequencies. Each component resonating structure, also referred to as an individual resonating structure, of the disclosed multizone resonating structures may operate with single or multiple frequencies. Each component resonating structure may have or be coupled to a radiating structure (e.g., an antenna) to inductively or capacitively couple with a plasma in an adjacent plasma chamber.

According to embodiments, the multizone resonating structures include individual radial zones or resonating structures arranged in a concentric fashion. The multizone resonating structures may include two or more individual resonating structures. The individual resonating structures may have cylindrical shapes or polygonal shapes as seen in top views. The individual resonating structures may be separated by shields. In other embodiments in which the substrates to be treated with plasma are large and rectangular, such as may be used for fabrication of flat panel displays, numerous individual resonating structures may be arranged adjoining each other in a rectangular grid and controlled by similar methods as described below.

According to embodiments, the multizone resonating structures include tuning elements to tune the resonant frequencies of the individual resonating structure(s) to which they are attached. The tuning elements may be parts of matching circuits coupled to components (e.g., inductors or capacitors) of the individual resonating structures and driven by an outside power.

According to embodiments, the individual resonating structures of the multizone resonating structures may be controlled separately or together by excitation hardware so that each resonating structure may be driven with a power level independent of the other resonating structures. The excitation hardware may include capacitive or inductive structures. The excitation hardware may be present in one individual resonating structure or in more than one resonating structure. The excitation hardware may be contained in an individual resonating structure or may extend into more than one individual resonating structure.

According to embodiments, the multizone resonating structures may include mutual couplings between antennas, controlled couplings between zones of influence in the generated plasmas, and controlled couplings between the power feeds and the generated plasma. Driving circuits of the zones of influence may include flexible matching circuits with harmonic sensing. The disclosed multizone resonating structures may be used with inductively coupled resonant antennas, capacitively coupled resonant antennas, or mixed inductively coupled and capacitively coupled resonant antennas. The zones of influence may be isolated by shields between individual resonating structures. The shields may be grounded, floating, or physically integrated with conductive components of the individual resonating structures.

According to an aspect, an apparatus for plasma processing includes a first resonating structure and a second resonating structure surrounding the first resonating structure, which may be referred to as a multizone resonating structure. The first resonating structure may be coupled to a first RF generator through a first matching circuit and the second resonating structure may be coupled to a second RF generator through a second matching circuit. The first RF generator and the second RF generator may be the same RF generator.

In embodiments, RF power trains for the coupling of RF power to plasma are organized as: an RF generator is coupled (e.g., through a first transmission line) to a matching circuit. The matching circuit is coupled (e.g., through a second transmission line) to a coupling structure, also referred to as a resonating structure. The coupling structure is coupled to a resonant antenna. The resonant antenna is coupled to a plasma in an adjacent plasma chamber.

FIG. 1 illustrates a diagram of an embodiment plasma processing system 100. The plasma processing system 100 includes an RF source 102, a multizone resonating structure 104, a plasma chamber 106, and, optionally, a dielectric plate 114, which may (or may not) be arranged as shown in FIG. 1. Further, the plasma processing system 100 may include additional components not depicted in FIG. 1.

In embodiments, RF source 102 includes an RF power supply, which may include a generator circuit and a matching circuit (not shown). The matching circuit may also be referred to as a matching network. The RF source 102 may supply a single frequency or multiple frequencies. In embodiments, the matching circuit couples the RF source 102 to the multizone resonating structure 104 across one or more capacitors, inductors, or both. In embodiments, the matching circuit is distributed over the multizone resonating structure 104. Impedance of the multizone resonating structure 104 may be different from impedance of the transmission lines between the generator circuit and the multizone resonating structure 104. This difference in impedance can lead to reflected RF power and decreased power efficiency. The matching circuit acts so that the impedance looking into the matching circuit from the generator circuit side is about equal to the internal impedance of the generator circuit. Thus, the matching circuit increases the efficiency of power coupling from the RF source 102 to the multizone resonating structure 104.

In embodiments, the RF source 102 is coupled to the multizone resonating structure 104 via a feeding structure 103. In embodiments, the feeding structure 103 may include a power transmission line, such as a coaxial cable or the like, an interface with conductive offsets (see below, FIG. 2A), the like, or a combination thereof. The RF source 102 provides forward RF waves to the multizone resonating structure 104. The multizone resonating structure 104 includes one or more resonating structures (see below, FIGS. 5A-5B) and one or more radiating structures. In embodiments, the one or more radiating structures are enclosed in a grounded box, which blocks electric fields and reduces magnetic fields for the safety of humans and provides a ground return path from the plasma chamber 106 back to the RF source 102. The forward RF waves travel through the multizone resonating structure 104 and are transmitted (i.e., radiated) towards plasma chamber 106.

Plasma chamber 106 includes a substrate holder 108. As shown, substrate no is placed on substrate holder 108 to be processed. Optionally, plasma chamber 106 may include a bias power supply 118 coupled to substrate holder 108. The plasma chamber 106 may also include one or more pump outlets 116 to remove by-products from plasma chamber 106 through selective control of gas flowrates within. In embodiments, pump outlets 116 are placed near (e.g., below/around the perimeter of) substrate holder 108 and substrate no.

In embodiments, the multizone resonating structure 104 is separated from the plasma chamber 106 by the dielectric plate 114, which is made of a dielectric material. Dielectric plate 114 separates the low-pressure environment within the plasma chamber 106 from the external atmosphere. It should be appreciated that the multizone resonating structure 104 can be placed directly adjacent to the plasma chamber 106, or the multizone resonating structure 104 can be separated from the plasma chamber 106 by air. In embodiments, the dielectric plate 114 is selected to minimize reflections of the RF wave from the plasma chamber 106. In other embodiments, the multizone resonating structure 104 is at least partially embedded within the dielectric plate 114.

In an embodiment, the multizone resonating structure 104 couples RF power from RF source 102 to the plasma chamber 106 to treat the substrate no. In particular, the multizone resonating structure 104 radiates one or more electromagnetic waves in response to being fed the forward RF waves from the RF source 102. The one or more radiated electromagnetic waves penetrate from the atmospheric side (i.e., the multizone resonating structure 104 side) of the dielectric plate 114 into the plasma chamber 106. The one or more radiated electromagnetic waves generates one or more respective electromagnetic fields within the plasma chamber 106. The generated one or more electromagnetic fields ignite and sustain plasma 112 by transferring energy to free electrons within the plasma chamber 106. The plasma 112 can be used to, for example, selectively etch or deposit material on substrate no.

In FIG. 1, the multizone resonating structure 104 is shown to be external to plasma chamber 106. In embodiments, however, the multizone resonating structure 104 can be placed internal to the plasma chamber 106.

In embodiments, one or more operating frequencies of the multizone resonating structure 104 are in a range of 1 MHz to 6 GHz. In embodiments, the power delivered by the multizone resonating structure 104 ranges from 10 W to 10 kW, determined by various factors such as distance from the multizone resonating structure 104, impedance values, or the like.

FIGS. 2A through 4B illustrate examples of resonating structures with variations in capacitor designs, in accordance with some embodiments. The resonating structures may be coupled to ground through one or more capacitive structures (e.g., fixed or variable capacitors). It should be appreciated that resonating structures of FIGS. 2A through 4B are non-limiting examples showing possible configurations of radiating structures, capacitors, and ground planes without coupling to power, and all of the examples may be coupled to power (e.g., an RF source) to generate plasma.

FIG. 2A illustrates a cross-sectional view of an example resonating structure (also referred to as a cavity) with a radiating structure 210 (also referred to as an antenna) coupled to a ground plane 202 (also referred to as a conductive plane) through two conductive plates 205. The example resonating structure may have any suitable shape in a top view, such as a round shape, a polygonal shape, or a ring shape (see below, FIG. 5B). In some embodiments, the radiating structure 210 is a spiral antenna. However, the radiating structure 210 may be any structure suitable for generating plasma. In some embodiments, the ground plane 202 is not grounded and is a common plate coupled to ground through, e.g., a matching circuit.

The conductive plates 205 are coupled to the radiating structure 210 by respective conductive offsets 208. Although the conductive offsets 208 are illustrated as being coupled to opposite ends of the radiating structure 210, the conductive offsets 208 may be coupled to any suitable positions on the radiating structure 210. For example, one conductive offset 208 may be coupled to an outer edge of the radiating structure 210, and another conductive offset 208 may be coupled to a center point of the radiating structure 210. The cross-section illustrated in FIG. 2A cuts through the illustrated conductive offsets 208. In embodiments, additional conductive offsets 208 or non-conductive (e.g., insulating) offsets are present between the radiating structure 210 and the conductive plates 205.

The conductive plates 205 are further coupled to the ground plane 202 across an insulating structure 204. The insulating structure 204 consists of an electrically insulating material such as a dielectric material or the like. In embodiments, the insulating structure 204 consists of air or vacuum.

FIG. 2B illustrates a schematic of the example resonating structure of FIG. 2A, also referred to as a floating resonating structure. Each capacitor 206 is formed by a conductive plate 205 coupled to the ground plane 202 across the insulating structure 204. The radiating structure 210 is coupled to the ground plane 202 through the two capacitors 206 so that a capacitor 206 is between the radiating structure 210 and the ground plane 202 on both ends of the radiating structure 210. The two capacitors 206 are representative of the equivalent capacitances of conductive structures including the respective conductive plates 205 and the ground plane 202. In some embodiments in which the radiating structure 210 is an inductor, the radiating structure 210 and the capacitors 206 form a CLC circuit.

FIG. 3A illustrates a cross-sectional view of an example resonating structure with a radiating structure 210 with one end coupled to a ground plane 202 through a wider conductive plate 205a and another end coupled to the ground plane 202 through the wider conductive plate 205a and a narrower conductive plate 205b.

A wider conductive plate 205a is separated from the ground plane 202 by a wider insulating structure 204a. The wider conductive plate 205a is coupled to the radiating structure 210 by a conductive offset 208. In some embodiments, the wider conductive plate 205a and the wider insulating structure 204a have respective widths equal to or greater than the width of the radiating structure 210.

A narrower conductive plate 205b is separated from the wider conductive plate 205a by a narrower insulating structure 204b. The narrower conductive plate 205b is coupled to the radiating structure 210 by a conductive offset 208. In some embodiments, the narrower conductive plate 205b and the narrower insulating structure 204b have respective widths less than the width of the radiating structure 210.

FIG. 3B illustrates a schematic of the example resonating structure of FIG. 3A, in which one end of the radiating structure 210 is coupled to the ground plane 202 through a capacitor 206a, and another end of the radiating structure 210 is coupled to the ground plane 202 through the capacitor 206a and capacitor 206b. The capacitor 206a is formed by the wider conductive plate 205a coupled to the ground plane 202 across the wider insulating structure 204. The capacitor 206b is formed by the narrower conductive plate 205b coupled to the wider conductive plate 205a across the narrower insulating structure 204b. The example resonating structure of FIGS. 3A and 3B includes an LC resonant circuit corresponding to the inductance of the radiating structure 210 coupled to the capacitance of the capacitor 206b.

FIG. 4A illustrates a cross-sectional view of an example resonating structure with a radiating structure 210 having one end grounded and another end coupled to the ground plane 202 through a conductive plate 205c. One end of the radiating structure 210 is coupled to the ground plane 202 through a conductive offset 208 (also referred to as a post).

A conductive plate 205c is separated from the ground plane 202 by an insulating structure 204c. The narrower conductive plate 205c is coupled to the radiating structure 210 by another conductive offset 208.

FIG. 4B illustrates a schematic of the example resonating structure of FIG. 4A, in which one end of the radiating structure 210 is grounded by a coupling to the ground plane 202 and another end of the radiating structure 210 is coupled to the ground plane 202 through the capacitor 206c. The capacitor 206c is formed by the conductive plate 205C coupled to the ground plane 202 across the insulating structure 204c. In some embodiments in which the radiating structure 210 is an inductor, the radiating structure 210 and the capacitor 206c form an LC circuit.

Figure 5A:
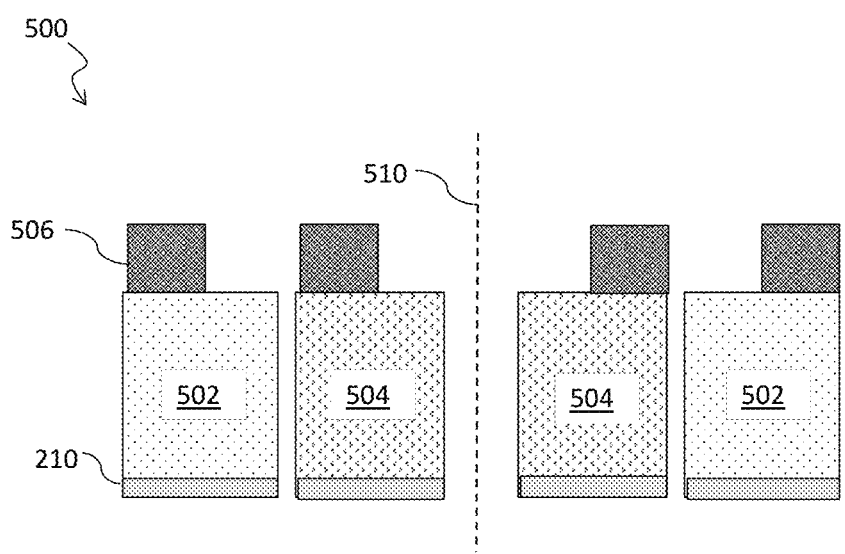
FIGS. 5A-5C are cross-sectional and top views of embodiment resonating structures.
Figure 5B:
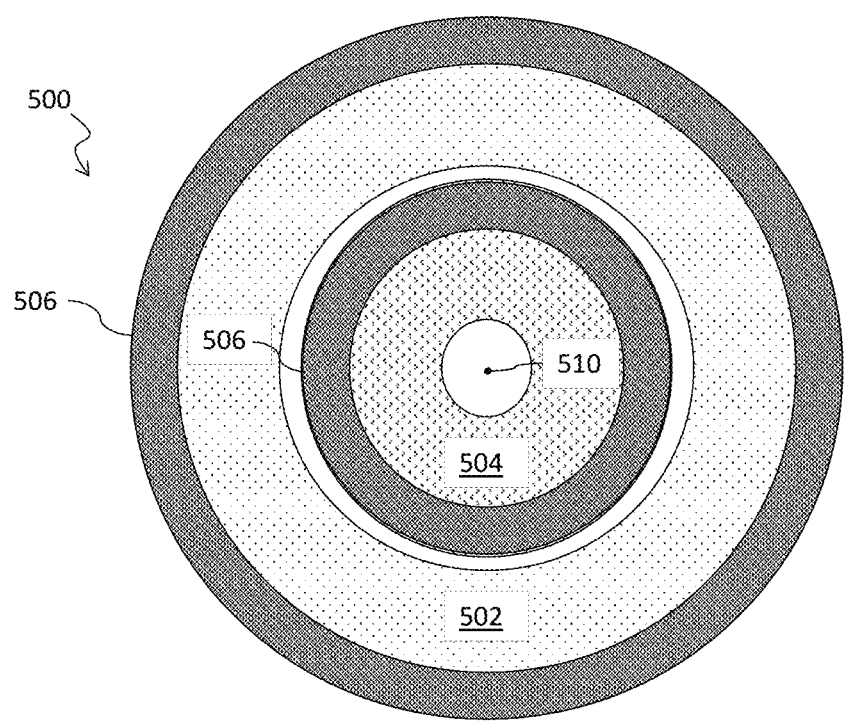

FIGS. 5A and 5B illustrate a multizone resonating structure 50o having an outer resonating structure 502 surrounding an inner resonating structure 504, in accordance with some embodiments. FIG. 5A illustrates a cross-sectional view of the multizone resonating structure 500, and FIG. 5B illustrates a top view of the multizone resonating structure 500. As shown in FIGS. 5A and 5B, the outer resonating structure 502 and the inner resonating structure 504 have cylindrical shapes centered on an axis 510. The outer resonating structure 502 and the inner resonating structure 504 are also referred to as radial zones or cavities. Although FIGS. 5A and 5B are shown with resonating structures having cylindrical shapes, it should be appreciated that the shape of the resonating structure (here, cylindrical) is non-limiting and other shapes may be similarly considered (see below, FIG. 5C).

The outer resonating structure 502 and the inner resonating structure 504 may each include respective radiating structures 210, capacitors, and conductive offsets as illustrated above in FIGS. 2A-4B. For example, the outer resonating structure 502 and the inner resonating structure 504 may each have a respective radiating structure 210 on their respective bottom sides. However, any suitable internal structure may be used for the outer resonating structure 502 and the inner resonating structure 504.

When using a single fixed resonant frequency, the amount of power coupled to a particular resonating structure (e.g., the outer resonating structure 502 or the inner resonating structure 504) may depend on the resonant frequency of the resonating structure relative to the fixed driving frequency of the power source (e.g., an RF source 102; see above, FIG. 1) coupled to the resonating structure. The amount of plasma produced by the resonating structure may be advantageously adjusted to a desired amount by tuning the resonant frequency of the resonating structure, such as by using a tuning element 506.

In some embodiments, respective tuning elements 506 are coupled to the outer resonating structure 502 and the inner resonating structure 504. The tuning elements 506 may be parts of matching circuits coupled to components (e.g., inductors or capacitors) of the outer resonating structure 502 and the inner resonating structure 504 and driven by an outside power. The tuning elements 506 tune the resonant frequency of the resonating structure(s) to which they are attached. The tuning elements 506 may be mechanical or electrical and include distributed multiple elements such as capacitors, inductors, or a combination thereof that may be individually switched on and off to alter the resonant frequency of the resonating structure(s). The tuning elements 506 may also be single variable components or elements such as a single variable capacitor (also referred to as a varactor) or a single variable inductor. In some embodiments, the tuning elements 506 include one or more element(s) with fixed capacitance or fixed inductance and one or more element(s) with variable capacitance or variable inductance.

It may be beneficial for the tuning elements 506 to be arranged in a symmetric pattern around the axis 510 in order to increase the symmetry of plasma generated by the outer resonating structure 502 and the inner resonating structure 504. However, it should be appreciated that the tuning elements 506 may be arranged in any suitable pattern, including asymmetric arrangements.

The tuning elements 506 form respective resonant circuits with the resonating structures and plasma generated in the adjacent plasma chamber 106 (see above, FIG. 1). For example, the outer resonating structure 502, a tuning element 506 coupled to the outer resonating structure 502, and plasma coupled to the outer resonating structure 504 form a resonant circuit, and the inner resonating structure 504, a tuning element 506 coupled to the inner resonating structure 504, and plasma coupled to the inner resonating structure 504 form a resonant circuit. The tuning elements 506 allow for the resonant frequencies of the respective resonant circuits including the outer resonating structure 502 and the inner resonating structure 504 to be tuned. In some embodiments, the tuning elements 506 allow the resonant frequencies of the resonant circuits to be tuned over a range of 0.01 MHz to 100 MHz from the resonant frequencies of resonant circuits without the tuning elements 506 being present.

The tuning element 506 may be controlled to match with load changes from the power source (e.g., the RF source 102; see above, FIG. 1). The tuning through the tuning element 506 can be applied to the outer resonating structure 502 and the inner resonating structure 504 with or without the tuning having a direct excitation effect on plasma in the plasma chamber 106 (see above, FIG. 1) adjacent to the outer resonating structure 502 and the inner resonating structure 504. In addition to the tuning through the tuning element 506, one side of a radiating structure 210 of the resonating structure(s) may be grounded (see above, FIG. 4A).

In some embodiments, the tuning elements 506 are not present in the multizone resonating structure 500. Without the presence of the tuning elements 506, the outer resonating structure 502 and the inner resonating structure 504 may have respective fixed resonant frequencies.

In some embodiments, the radiating structures 210 of the outer resonating structure 502 and the inner resonating structure 504 are inductors and have mutual inductive coupling between them.

Figure 5C:
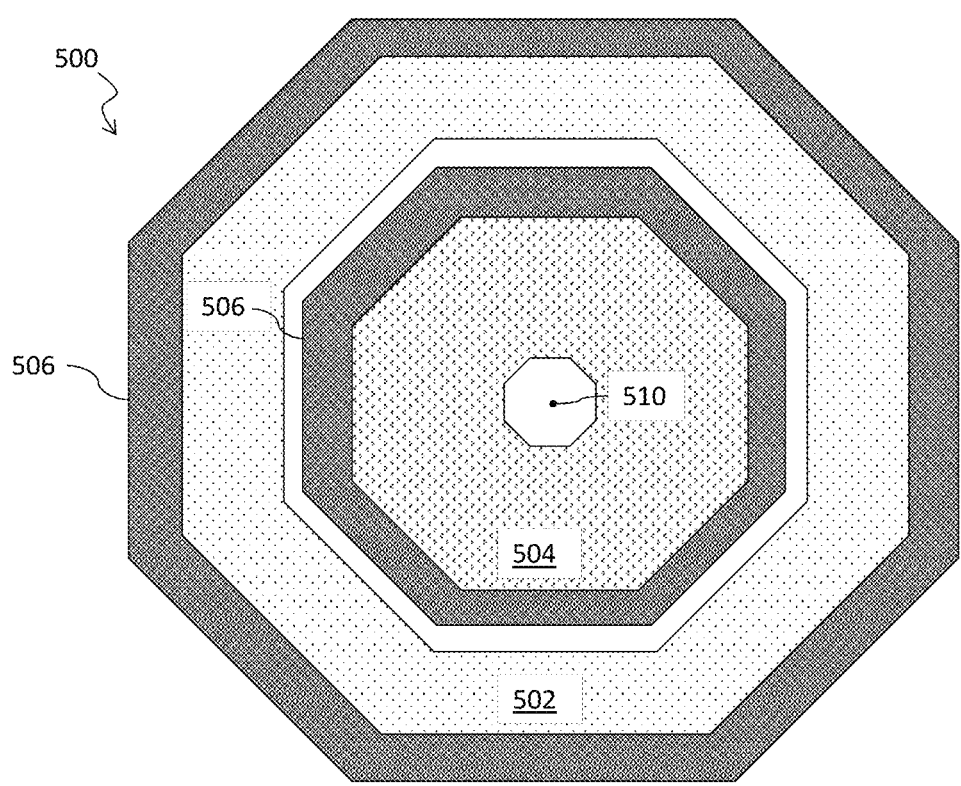

FIG. 5C illustrates a top view of an embodiment of the multizone resonating structure 500 in which the outer resonating structure 502, the inner resonating structure 504, and the tuning elements 506 have polygonal inner and outer sidewalls. As illustrated in FIG. 5C, the multizone resonating structure 500 has an octagonal shape in a top view. However, the multizone resonating structure 500 may have any suitable shape, such as a square shape, pentagonal shape, hexagonal shape, dodecagonal shape, or the like, and any suitable combination of straight and curved sidewalls are understood to be within the scope of the embodiments.

Figure 5D:
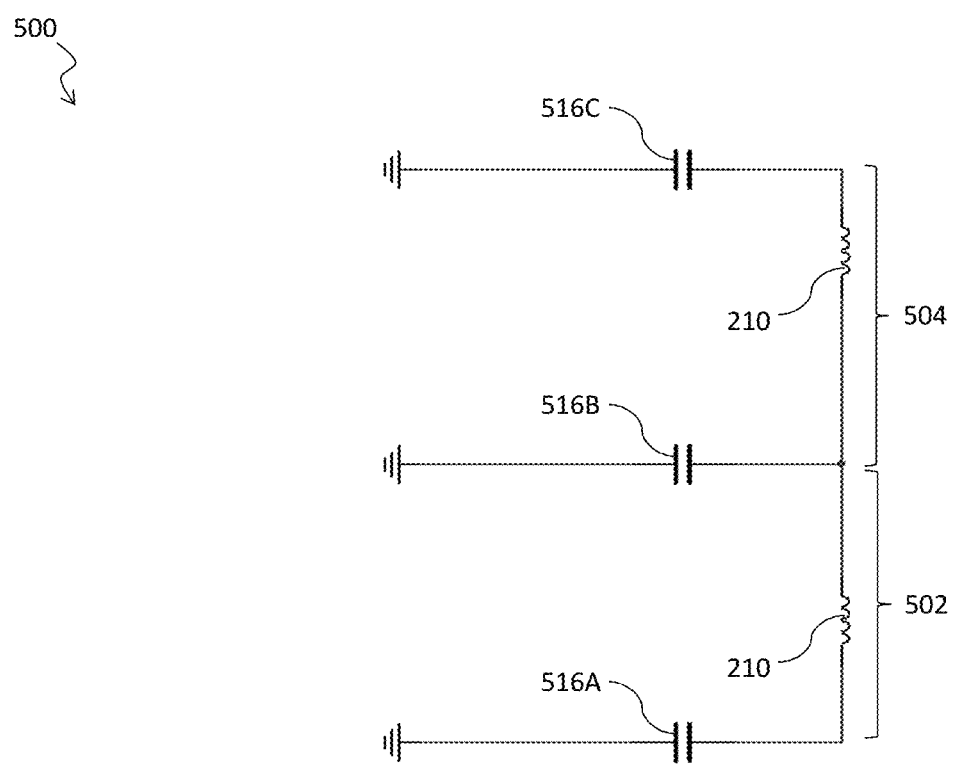
FIG. 5D is a schematic of the embodiment resonating structure of FIG. 5A.

FIG. 5D illustrates an example schematic of the multizone resonating structure 500 of FIG. 5A in which the outer resonating structure 502 and the inner resonating structure 504 share a capacitor. The radiating structure 210 of the outer resonating structure 502 is coupled to ground across capacitors 516A and 516B, and the radiating structure 210 of the inner resonating structure 504 is coupled to ground across capacitors 516B and 516C. As such, the capacitor 516B is shared by the outer resonating structure 502 and the inner resonating structure 504, such as by sharing one or more conductive offsets 208 (see above, FIG. 2A) at the boundary of the outer resonating structure 502 and the inner resonating structure 504.

In some embodiments, although the outer resonating structure 502 and the inner resonating structure 504 of FIG. 5D share the capacitor 5126B, they operate at different frequencies that are supplied as two sets of pulses having different frequencies or multi-tone mixing of two or more frequencies.

Figure 5E:
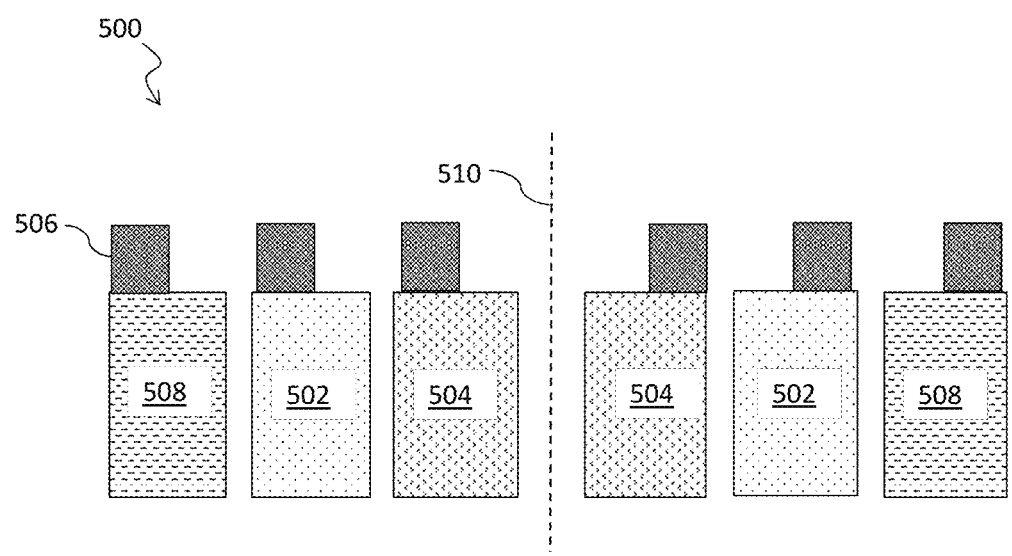
FIGS. 5E and 5F are cross-sectional and top views of embodiment resonating structures.
Figure 5F:
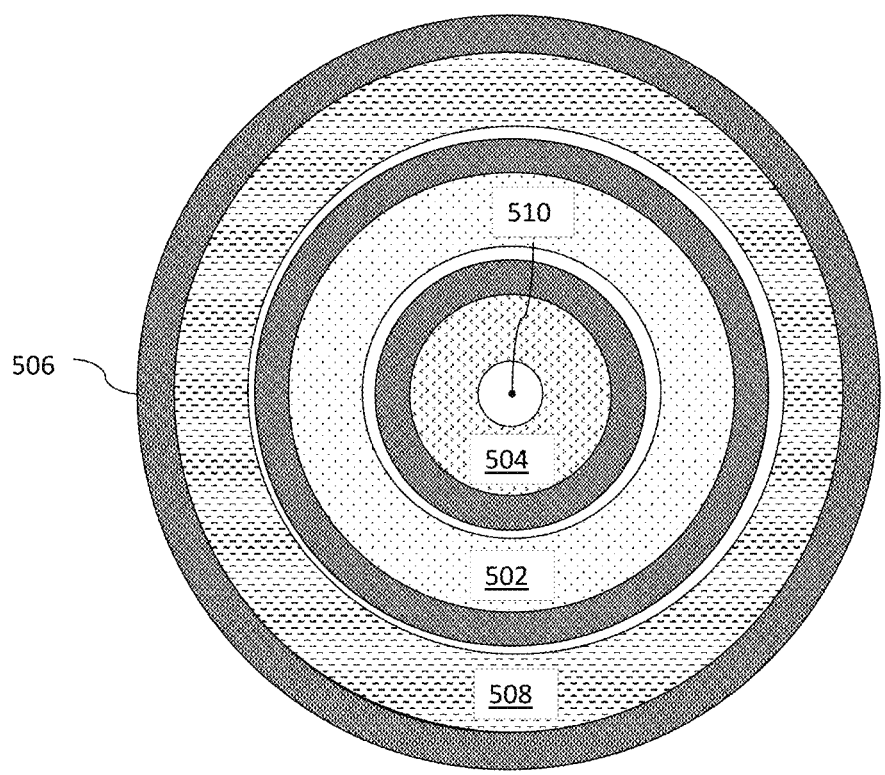

FIGS. 5E and 5F illustrate a cross-sectional view and a top view, respectively, of an embodiment of the multizone resonating structure 500. As shown, an additional resonating structure 508 surrounds the outer resonating structure 502 and the inner resonating structure 504. As illustrated in FIG. 5E, the multizone resonating structure 500 has three individual resonating structures around the axis 510. However, the multizone resonating structure 500 may include any suitable number of resonating structures, such as four to six resonating structures, arranged around the axis 510. For an example plasma reactor or chamber (e.g., one designed for the manufacturing of flat panel displays) with resonating structures arranged in a grid pattern, the number of resonating structures may be larger than six, such as sixteen to thirty-two resonating structures. Additionally, respective tuning elements 506 may be present on the outer resonating structure 502, the inner resonating structure 504, the additional resonating structure 508, or any combination thereof.

As illustrated in FIG. 5F, the outer resonating structure 502, the inner resonating structure 504, and the additional resonating structure 508 have round shapes in a top view. However, the outer resonating structure 502, the inner resonating structure 504, the additional resonating structure 508, and any other resonating structure(s) arranged around the axis 510 may have any suitable round or polygonal shape with any combination of straight or round sidewalls.

Figure 5G:
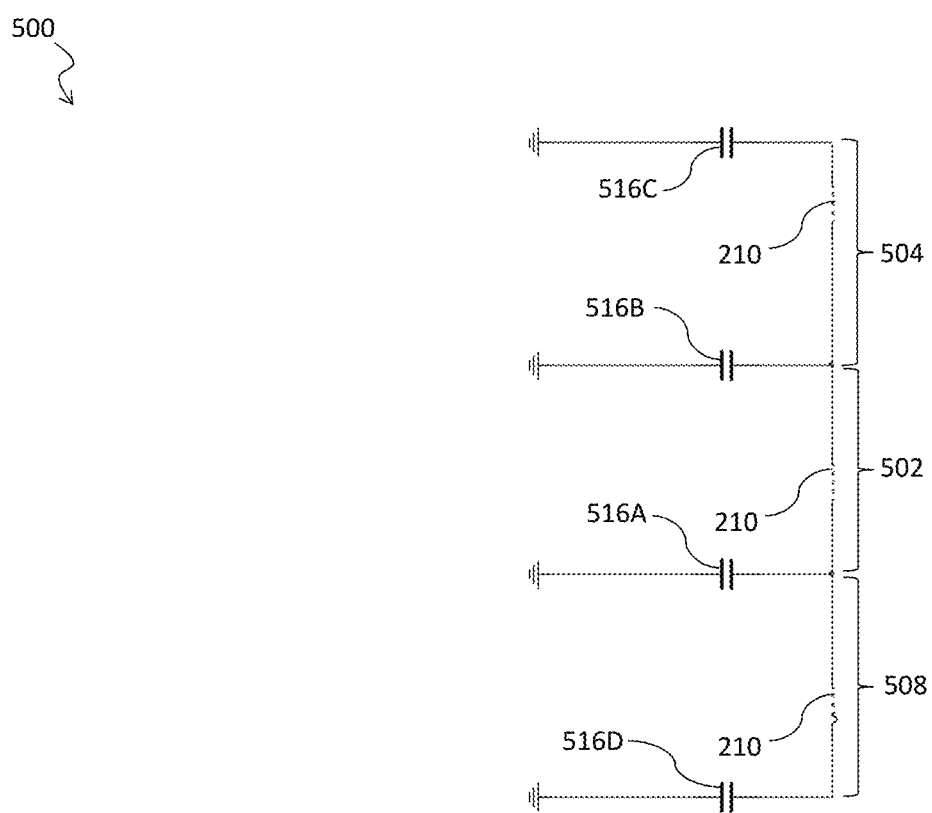
FIG. 5G is a schematic of the embodiment resonating structure of FIG. 5E.

FIG. 5G illustrates an example schematic of the multizone resonating structure 500 of FIGS. 5E and 5F in which the outer resonating structure 502 and the inner resonating structure 504 share a capacitor and the outer resonating structure 502 and the additional resonating structure 508 share a capacitor. The radiating structure 210 of the outer resonating structure 502 is coupled to ground across capacitors 516A and 516B, the radiating structure 210 of the inner resonating structure 504 is coupled to ground across capacitors 516B and 516C, and the radiating structure 210 of the additional resonating structure 502 is coupled to ground across capacitors 516A and 516D. As such, the capacitor 516A is shared by the outer resonating structure 502 and the additional resonating structure 508, and the capacitor 516B is shared by the outer resonating structure 502 and the inner resonating structure 504.

FIGS. 6-12 illustrate various embodiments of multizone resonating structures with excitation hardware. The multizone resonating structures of FIGS. 6-12 may have similar structures as the multizone resonating structure 500 described above with respect to FIGS. 5A and 5B, with like elements described by like numerals. For example, the multizone resonating structures may have cylindrical shapes and are shown along the same cross-sectional view as illustrated in FIG. 5A.

Figure 6:
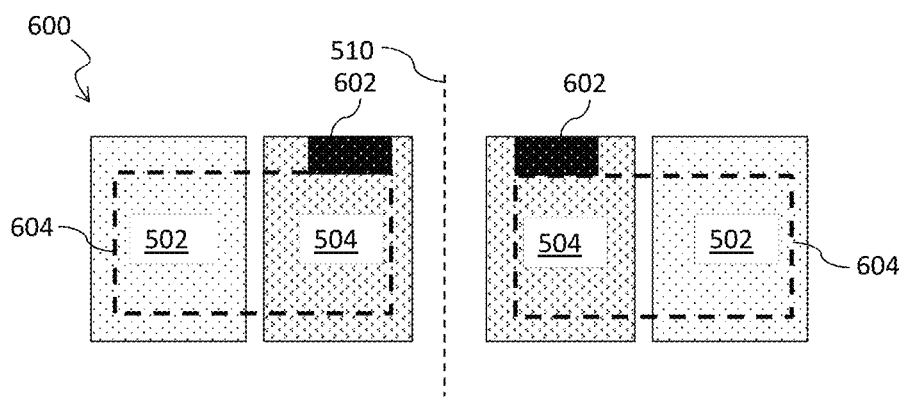
FIGS. 6-16 are cross-sectional views of embodiment resonating structures.

FIG. 6 illustrates an example multizone resonating structure 600 with excitation hardware, in accordance with some embodiments. An excitation component 602 is physically present in the inner resonating structure 504 of the multizone resonating structure 600. The excitation component 602 may be a suitable piece of hardware, such as an inductive coil producing a magnetic field or a capacitor producing an electric field, capable of exerting an influence or excitation on electric or magnetic fields in resonating structures of the multizone resonating structure 600. In some embodiments, the excitation component 602 exerts an influence or excitation on a plasma 112 in the plasma chamber 106 (see above, FIG. 1). The excitation component 602 is driven by a power source or outside generator (e.g., RF source 102; see above, FIG. 1) that may be coupled to the excitation component through a matching circuit.

As illustrated in FIG. 6, a zone of influence 604 of the excitation component 602 extends through the inner resonating structure 504 and through the outer resonating structure 502. As an example, the zone of influence 604 may be the magnetic field generated by the excitation component 602 when the excitation component 602 is an inductive coil. In some embodiments, the zone of influence 604 includes a magnetic field coupled from the radiating structure to the plasma 112 with a strength in a range of 0.1 G to 2 T, or an electric field with a strength in a range of 1 V/cm to 3000 V/cm. An electric field may be induced in the plasma 112 with a strength in a range of 10 V/cm to 300 V/cm, or an electric current in a range of 1 A to 20 A may be induced in the plasma. The excitation component 602 may excite electric or magnetic fields in the inner resonating structure 504 and the outer resonating structure 502, and the electric or magnetic fields may then desirably excite the plasma 112 to advantageously improve the energy or density of the plasma. This may be useful for the plasma treatment of substrates.

It may be beneficial for the excitation hardware (including the excitation component 602) to be arranged in a symmetric pattern around the axis 510 to increase the symmetry of the plasma generated by the outer resonating structure 502 and the inner resonating structure 504. However, it should be appreciated that the excitation hardware may be arranged in any suitable pattern, including asymmetric arrangements.

Figure 7:
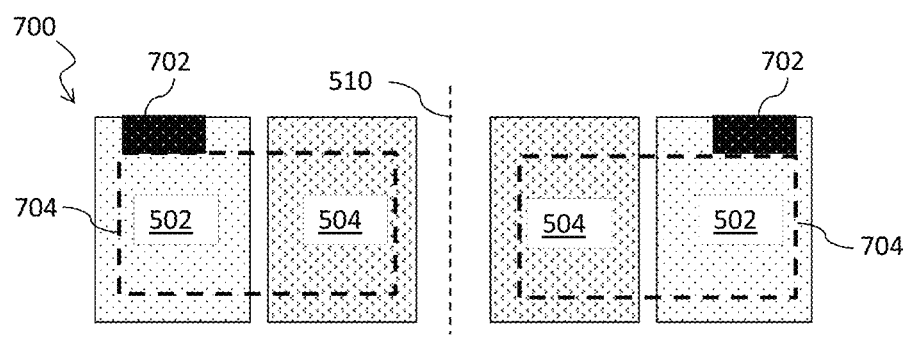

FIG. 7 illustrates an example multizone resonating structure 700 with excitation hardware, in accordance with some embodiments. An excitation component 702 is physically present in the outer resonating structure 502 of the multizone resonating structure 700. The excitation component 702 may be a suitable piece of hardware similar to the excitation component 602 as described above with respect to FIG. 6. As illustrated in FIG. 7, a zone of influence 704 of the excitation component 702 extends through the inner resonating structure 504 and through the outer resonating structure 502. As illustrated in FIGS. 6 and 7, excitation hardware may be present in either the inner resonating structure 504 or the outer resonating structure 502 and generate a zone of influence through both the inner resonating structure 504 and the outer resonating structure 502.

Figure 8:
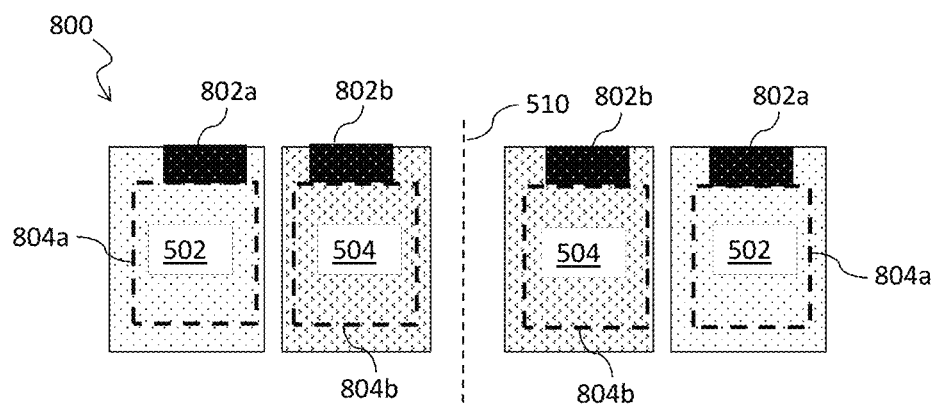

FIG. 8 illustrates an example multizone resonating structure 800 with excitation hardware, in accordance with some embodiments. In FIG. 8, an excitation component 802a is physically present in the outer resonating structure 502 of the multizone resonating structure 800, and another excitation component 802b is physically present in the inner resonating structure 504 of the multizone resonating structure 800. The excitation component 802a in the outer resonating structure 502 generates a zone of influence 804a in the outer resonating structure 502, and the excitation component 802b in the inner resonating structure 504 generates a zone of influence 804b in the inner resonating structure 504.

Figure 9:
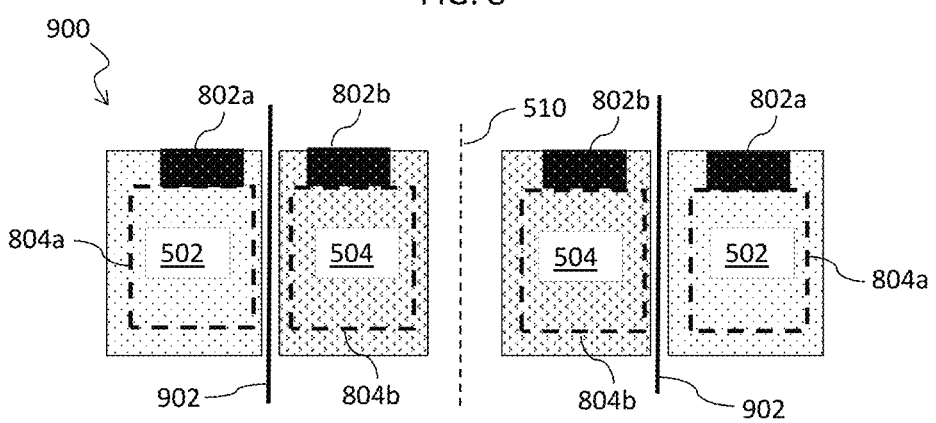

FIG. 9 illustrates an example multizone resonating structure 900 with excitation hardware and a shield separating the outer resonating structure 502 from the inner resonating structure 504, in accordance with some embodiments. The multizone resonating structure 900 may be similar to the multizone resonating structure 800 described above with respect to FIG. 8, with the addition of a shield 902.

The shield 902 separates the outer resonating structure 502 from the inner resonating structure 504. The zones of influence 804a and 804b of each respective excitation component 802a and 802b may be confined to the respective resonating structures containing the excitation component 802a or 802b due to the shield.

As an example, the shield 902 may be a cylindrical sheet of conductive material, such as copper or the like. In some embodiments, the shield 902 has a thickness in a range of 0.1 mm to 12.7 mm. The shield 902 may stop the penetration of electric fields from capacitive coupling and reduce the penetration of magnetic fields from inductive coupling. In some embodiments, the shield 902 is a metal such as aluminum. The shield 902 may be coupled to ground or may be floating. In some embodiments, the shield 902 has an inner or outing liner of absorbent material that absorbs or blocks magnetic or electric fields, such as a high permeability Ferrite (cobalt nickel zinc) material for frequencies in a range of 2 MHz to 150 MHz. In some embodiments, the shield 902 is physically coupled to an insulating structure 204 (see above, FIG. 2A). For example, the shield 902 may be supported by dielectric supports coupled to the insulating structure 204. Shielding can be part of an integrated support, such as laminating conductive offsets 208 that coupled the radiating structure 210 to the capacitor 206 (see above, FIGS. 2A-2B). For example, conductive offsets 208 comprising aluminum may be laminated with a tin-based material.

Figure 10:
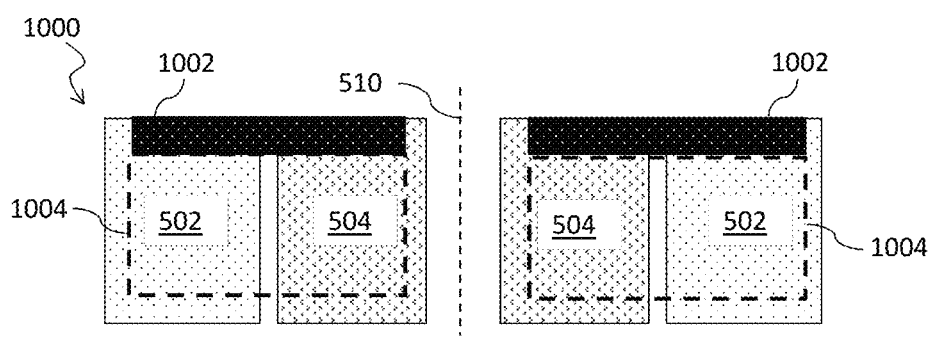

FIG. 10 illustrates an example multizone resonating structure 1100 with excitation hardware extending into and influencing multiple resonating structures, in accordance with some embodiments. The excitation component 1002 extends into both the inner resonating structure 504 and the outer resonating structure 502. A zone of influence 1004 generated by the excitation component 1002 extends through both the inner resonating structure 504 and the outer resonating structure 502.

Figure 11:
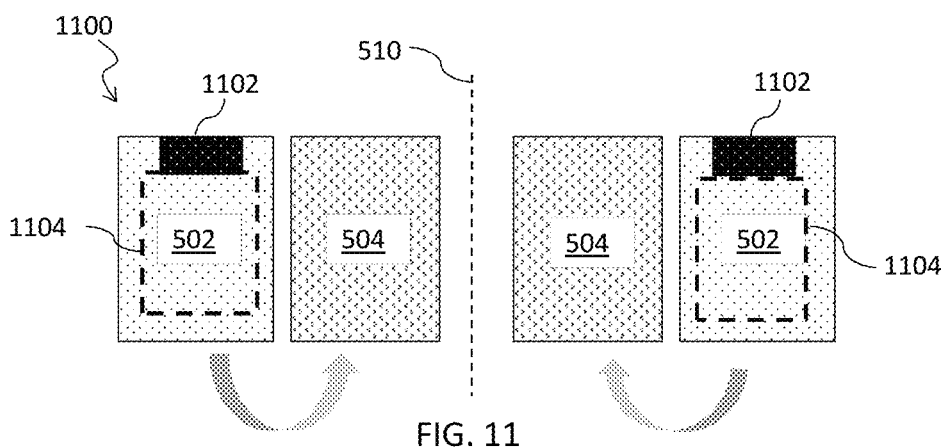
Figure 12:
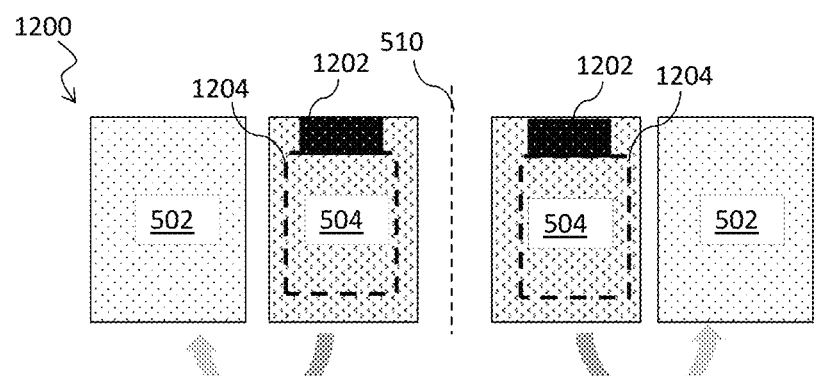

FIGS. 11 and 12 illustrate examples of multizone resonating structures 1100 and 1200, respectively, with coupling of electric or magnetic fields in zones of influence to neighboring resonating structures. Electric or magnetic fields in a zone of influence with local influence in one resonating structure may couple to the electric or magnetic fields in the other resonating structure and excite the electric or magnetic fields of the other resonating structure. This may occur when the resonant frequencies of the outer resonating structure 502 and the inner resonating structure 504 have a difference of 100 MHz or less, such as a difference in a range of 1 kHz to 2000 kHz. Undesirable coupling between neighboring resonating structures may be reduced or prevented by supplying RF power in pulses or by shielding the resonating structures from each other.

In FIG. 11, an excitation component 1102 is present in the outer resonating structure 502 and generates a zone of influence 1104 with local influence on electric or magnetic fields in the outer resonating structure 502. However, the outer resonating structure 502 is coupled capacitively or inductively to the inner resonating structure 504. As illustrated by the arrows, once the outer resonating structure 502 is excited, the electric or magnetic fields in the outer resonating structure 502 further couple to electric or magnetic fields in the inner resonating structure 504 by capacitive or inductive coupling.

In FIG. 12, an excitation component 1202 is present in the inner resonating structure 504 and generates a zone of influence 1204 with local influence on electric or magnetic fields in the inner resonating structure 504. However, the inner resonating structure 504 is coupled capacitively or inductively to the outer resonating structure 502. As illustrated by the arrows, once the inner resonating structure 504 is excited, the electric or magnetic fields in the inner resonating structure 504 further couple to electric or magnetic fields in the outer resonating structure 502 by capacitive or inductive coupling.

Further referring to FIGS. 11 and 12, plasma (e.g., in an adjacent plasma chamber 106; see FIG. 1) coupled to and excited by electric or magnetic fields from a zone of influence in one resonating structure (e.g., the outer resonating structure 502) may capacitively or inductively couple to plasma coupled to a neighboring resonating structure (e.g., the inner resonating structure 504). In some embodiments, this capacitive or inductive coupling of the plasma coupled to neighboring resonating structures (e.g., the outer resonating structure 502 and the inner resonating structure 504) occurs when the plasma has a density in a range of $10^9$ cm$^{-3}$ to $10^{12}$ cm$^{-3}$, at an ion energy in a range of 0.5 eV to 15 eV, with a magnetic flux density in a range of 0.1 G to 100 G.

In some embodiments, inductive coupling occurs between dielectric material (e.g., in the dielectric plate 114; see above, FIG. 1) adjacent to one resonating structure and dielectric material adjacent to a neighboring resonating structure. The dielectric material may have a thickness in a range of 20 mm to 25 mm in support of the vacuum in the plasma chamber 106.

FIGS. 13 through 16 illustrate partial cross-sections through example multizone resonating structures in which the cross-sections pass through each resonating structure once. For example, for multizone resonating structures having cylindrical shapes, FIGS. 13 through 16 illustrate respective partial cross-sections from left sides of respective outer resonating structure 502 to respective central axes 510 (not illustrated; see above, FIG. 5A) of the respective multizone resonating structures.

Figure 13:
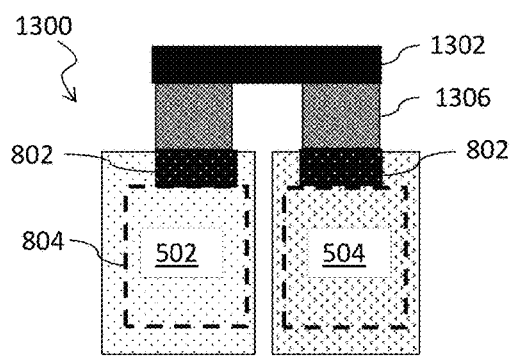

FIG. 13 illustrates an example multizone resonating structure 1300 with excitation hardware and variable coupling elements, in accordance with some embodiments. Respective excitation components 802 are present in the outer resonating structure 502 and the inner resonating structure 504, each generating a zone of influence 804. The excitation components 802 are coupled to a power distribution common element 1302 (also referred to as a bus) by respective variable coupling elements 1306. The power distribution common element 1302 may be coupled to an RF generator (e.g., the RF source 102; see above, FIG. 1).

The variable coupling elements 1306 may be inductive or capacitive. The power and frequencies supplied to the excitation components 802 may be controlled by varying the inductance or the capacitance of the variable coupling elements 1306. This enables different amounts of power or different frequencies to be supplied to the excitation components 802 through the single power distribution common element 1302. Either one frequency or two frequencies may be supplied to the excitation components 802. In embodiments in which additional resonating structures with respective excitation components 802 and variable coupling elements 1306 are present, more than two frequencies may be supplied to the excitation components 802.

Figure 14:
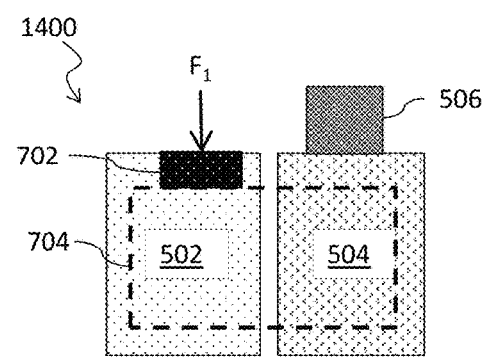
Figure 15:
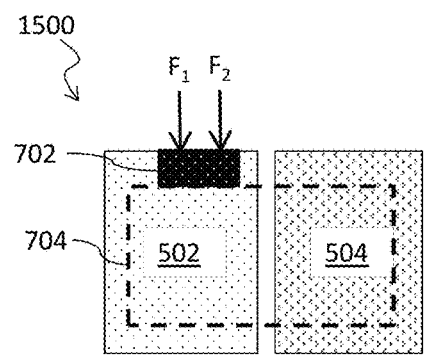
Figure 16:
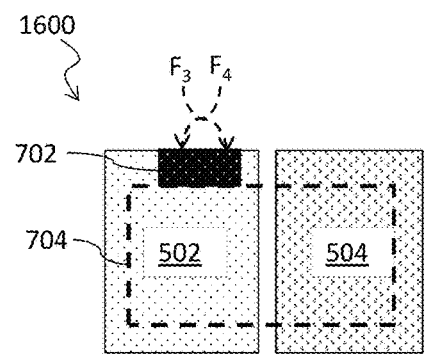

FIGS. 14-16 illustrate different excitation methods for single excitation hardware configurations, in accordance with some embodiments. The excitation methods of FIGS. 14-16 allow for control of single resonating structures by one or more frequencies through excitation components.

In FIG. 14, a multizone resonating structure 1400 includes an excitation component 702 in the outer resonating structure 502 and a tuning element 506 coupled to the inner resonating structure 504. The excitation component 702 generates a zone of influence 704 in both the outer resonating structure 502 and the inner resonating structure 504. A first frequency $F_1$ is supplied through the excitation component 702, and the tuning element 506 enables the resonant frequency of the inner resonating structure 504 to be controlled independently from the resonant frequency of the outer resonating structure 502. This allows for the resonant frequency of the inner resonating structure 504 to be set either closer to or farther away from the first frequency $F_1$ through the operation of the tuning element 506.

It should be appreciated that the excitation component 702 is in the outer resonating structure 502 and the tuning element 506 is coupled to the inner resonating structure 504 as a non-limiting example. Any combination of excitation components and tuning components with respective resonating structures is within the scope of the embodiments illustrated in FIGS. 14-16. For example, any resonating structure may have a respective excitation component and be coupled to a respective tuning element.

In FIG. 15, a multizone resonating structure 1500 includes an excitation component 702 in the outer resonating structure 502, with a first frequency $F_1$ and a second frequency $F_2$ supplied concurrently to the excitation component 702. As such, the excitation component 702 generates a zone of influence 704 in both the outer resonating structure 502 and the inner resonating structure 504, which is controlled by the first frequency $F_1$ and the second frequency $F_2$.

In some embodiments, the first frequency $F_1$ is closer to the resonant frequency of the outer resonating structure 502 and more strongly influences the outer resonating structure 502, and the second frequency $F_2$ is closer to the resonant frequency of the inner resonating structure 504 and more strongly influences the inner resonating structure 504. The amount of power provided to each of the outer resonating structure 502 and the inner resonating structure 504 can be controlled by controlling, e.g., the amplitudes of the waveforms having the first frequency $F_1$ and the second frequency $F_2$.

In FIG. 16, a multizone resonating structure 1600 includes an excitation component 702 in the outer resonating structure 502, with a third frequency $F_3$ and a fourth frequency $F_4$ supplied to the excitation component 702 as interleaved pulses. As such, the excitation component 702 generates a zone of influence 704 in both the outer resonating structure 502 and the inner resonating structure 504, which is controlled by interleaved pulses of the third frequency $F_3$ and the fourth frequency $F_4$.

In some embodiments, the third frequency $F_3$ is closer to the resonant frequency of the outer resonating structure 502 and more strongly influences the outer resonating structure 502, and the fourth frequency $F_4$ is closer to the resonant frequency of the inner resonating structure 504 and more strongly influences the inner resonating structure 504. The amount of power provided to each of the outer resonating structure 502 and the inner resonating structure 504 can be controlled by controlling, e.g., the lengths and amplitudes of the interleaved pulses.

FIGS. 17-28 illustrate various examples of the embodiments described above with respect to FIGS. 2A-16. The examples illustrated by FIGS. 17-28 include low impedance coupling with various configurations of capacitors and mutual inductive coupling that places radiating structures (e.g., antennas) in close enough proximity to enable strong mutual coupling. It should be appreciated that the examples of FIGS. 17-28 are non-limiting, and embodiments including any suitable combination of features from the examples of FIGS. 17-28 are within the scope of the disclosure.

Figure 17:
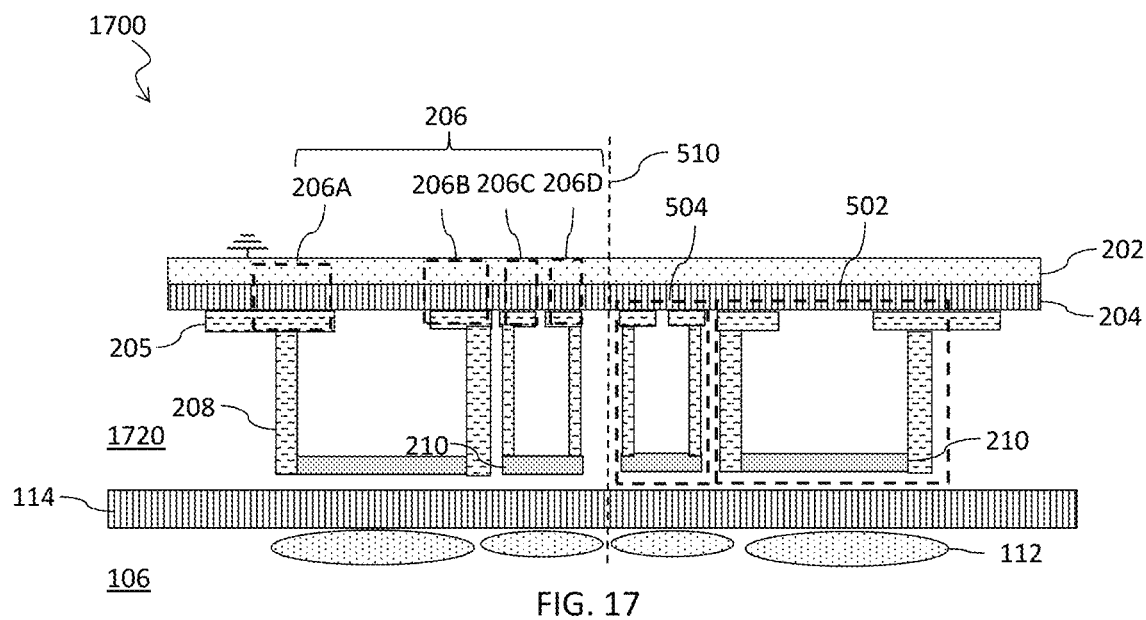

FIG. 17 illustrates a cross-sectional view of a multizone resonating structure 1700 that is a detailed example of the multizone resonating structure 800 described above with respect to FIG. 5A but without tuning elements. The multizone resonating structure 1700 is illustrated without including any excitation components (also referred to as excitation components), such as inductive drive coils or capacitors or tuning elements. However, it should be appreciated that the multizone resonating structure 1700 is a non-limiting example and embodiments may include any suitable combination of excitation components, tuning elements, power feeds, or matching circuits as described above or below.

In FIG. 17, the multizone resonating structure 1700 is illustrated as being positioned in an atmosphere 1720 above a dielectric plate 114 over a plasma chamber 106. The dielectric plate 114 and the plasma chamber 106 may have similar structures as described above with respect to FIG. 1. The plasma chamber 106 contains plasma 112 in a near-vacuum environment. The plasma 112 is inductively coupled to the respecting radiating structures 210 of the outer resonating structure 502 and the inner resonating structure 504.

Each of the outer resonating structure 502 and the inner resonating structure 504 include respective capacitors 206 formed by the coupling of conductive plates 205 to the ground plane 202 across the insulating structure 204. Although the ground plane 202 is illustrated as grounded, the ground plane 202 may be floating or coupled to any suitable reference voltage. Each capacitor 206 may be either grounded, floating, or coupled to any suitable reference voltage. In embodiments where, e.g., one capacitor 206 is grounded and another capacitor 206 is floating, the ground plane 202 may have a gap or dielectric structure electrically isolating the grounded capacitor 206 from the floating capacitor 206.

In the illustrated embodiment of FIG. 17, the outer resonating structure 502 has an outer capacitor 206A and an inner capacitor 206B, and the inner resonating structure 502 has an outer capacitor 206C and an inner capacitor 206D. In other embodiments, the outer resonating structure 502 and inner resonating structure 504 may have different numbers or configurations of capacitors. For example, the outer resonating structure 502 and inner resonating structure 504 may have a shared capacitor and a shared conductive offset at their boundary (see below, FIG. 20).

In some embodiments, a ground enclosure (not illustrated) extends from the ground plane 202 and encloses the plasma chamber 106, the outer resonating structure 502, and the inner resonating structure 504. The ground enclosure provides a ground return for power that is coupled into the plasma 112.

In some embodiments, the outer resonating structure 502 and the inner resonating structure 504 of the multizone resonating structure 1700 are each a floating resonance circuit zone including a respective outer capacitor 206, a respective radiating structure 210, and a respective inner capacitor 206. Any combination of the capacitors 206 may be grounded. The radiating structures 210 inductively couple to plasma 112 in the plasma chamber 106.

In some embodiments, the respective radiating structures 210 include eight arms with Archimedean spiral shapes disposed between a respective inner ring and a respective outer ring. Each arm of the respective radiating structures 210 may be coupled through the respective inner and outer rings to common capacitors 206. In other embodiments, the arms are electrically isolated from each other by slits or dielectric material.

Figure 18:
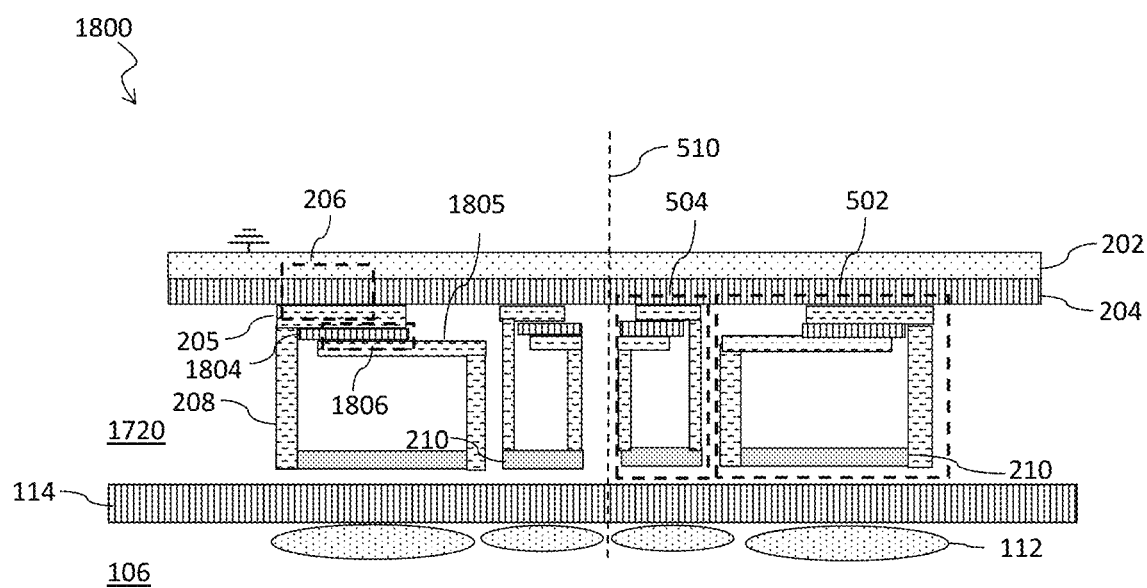

FIG. 18 illustrates a cross-sectional view of a multizone resonating structure 1800 that is similar to the multizone resonating structure 1700 (see above, FIG. 17) but including a stacked capacitor design. The outer resonating structure 502 and the inner resonating structure 504 each include respective conductive plates 1805 that overlap with the respective conductive plates 205. Respective insulating structures 1804 are disposed between the conductive plates 1805 and the conductive plates 205. Capacitors 206 are formed by the coupling of the conductive plates 205 with the ground plane 202 across the insulating structure 204, and capacitors 1806 are formed by the coupling of the conductive plates 1805 with the conductive plates 205 across the insulating structures 1804.

As shown in FIG. 18, the capacitors 206 and the capacitors 1806 are stacked in the outer resonating structure 502 and the inner resonating structure 504. This provides a more compact design and may allow for a reduction in the respective radii of the outer resonating structure 502 and the inner resonating structure 504 and the inclusion of one or more additional resonating structure(s) around the outer resonating structure 502 in the same amount of space.

The multizone resonating structure 1800 is illustrated without including any couplings to power drives (e.g., inductive drive coils or capacitors) or tuning elements. However, it should be appreciated that the multizone resonating structure 1800 is a non-limiting example and embodiments may include any suitable combination of excitation components, tuning elements, power feeds, or matching circuits as described above or below.

Figure 19:
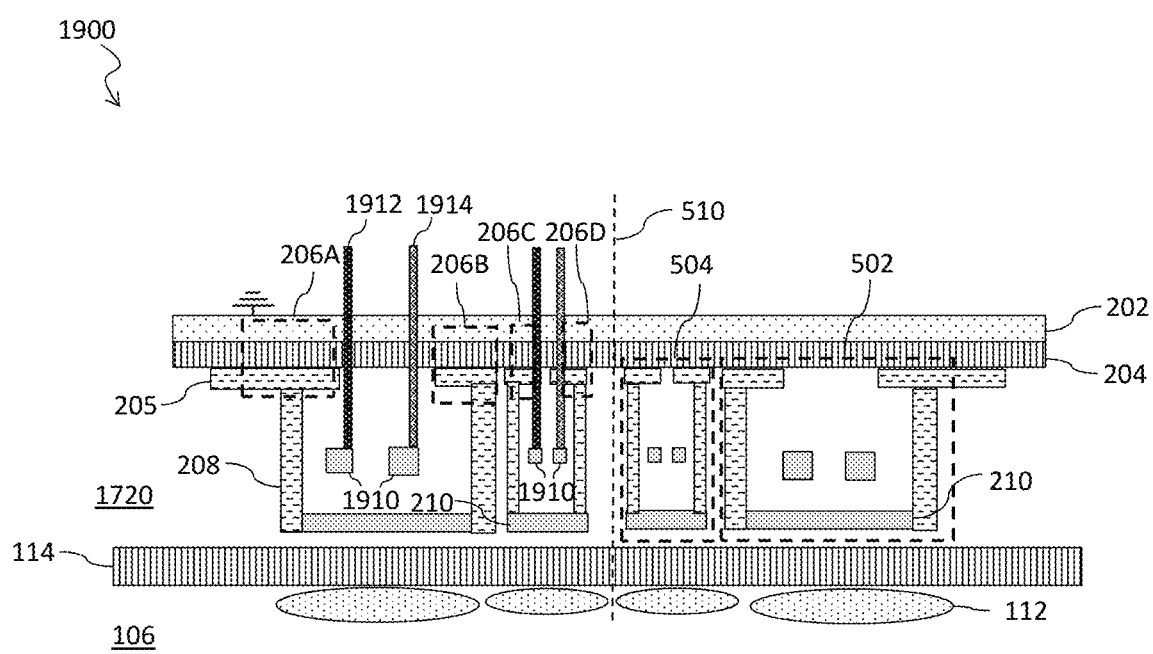

FIG. 19 illustrates a cross-sectional view of a multizone resonating structure 1900 that is a detailed example of inductive power coupling in an embodiment of the multizone resonating structure 800 described above with respect to FIG. 8. The multizone resonating structure 1900 is similar to the multizone resonating structure 1700 as described above with respect to FIG. 17, but it further includes inductive drive coils 1910 in each of the outer resonating structure 502 and inner resonating structure 504 that act as excitation components to inductively couple with the respective radiating structures 210 of the outer resonating structure 502 and inner resonating structure 504. The inductive drive coils 1910 may be isolated from plasma generation by being separated from a grounded chamber wall or shield of the plasma chamber 106 (see above, FIG. 1) by a distance in a range of 5 mm to 100 mm.

Each inductive drive coil 1910 is coupled to a respective power feed 1912 and a respective ground or matching circuit 1914. Each inductive drive coil 1910 may receive single or variable frequencies through the respective power feeds 1912. The ground or matching circuit 1914 may be coupled either to ground or to a matching circuit. In some embodiments, the power feed 1912 includes multiple power feeds for separate power and frequency control.

The inductive drive coils 1910 of the outer resonating structure 502 and the inner resonating structure 504 have inductive coupling with respective radiating structures 210 of the outer resonating structure 502 and the inner resonating structure 504 in order to transfer power to the plasma 112 through the radiating structures 210. The inductive drive coils 1910 may be designed to be resonant or non-resonant. Power can be transferred at two different frequencies through the same inductive drive coil 1910 and power feed 1912. The radiating structures 210 may function as both inductive pickups for power and inductive antennas for coupling to the plasma 112.

In some embodiments, the inductive drive coils 1910 are present in each of the outer resonating structure 502 and inner resonating structure 504 as single turn coils. The inductive drive coils 1910 are independent of each other and may each have a single turn or a multi-turn design. However, the inductive drive coils 1910 can be in any shape that couples to the respective radiating structure 210. For example, the inductive drive components may be arcs or line segments that match the patterns of the respective radiating structures 210 rather than coils. In some embodiments, the inductive drive coils 1910 are each a pair of half coils that cover 180° each of the azimuthal plane, with each respective half coil having its own respective power feed and ground or matching circuit coupling.

Figure 20:
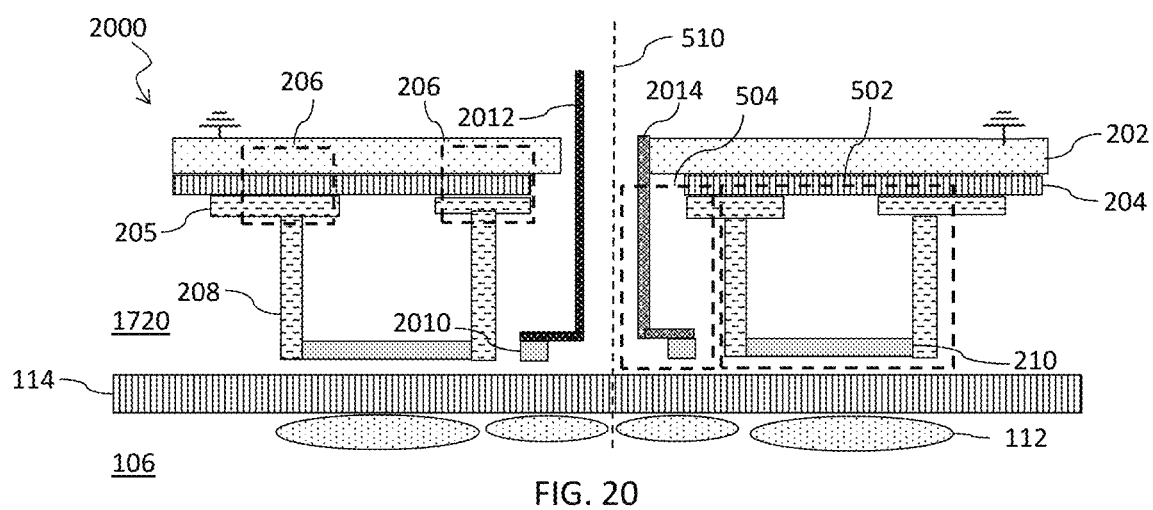

FIG. 20 illustrates a cross-sectional view of a multizone resonating structure 2000 that is a detailed example of inductive power coupling in an embodiment of the multizone resonating structure 600 described above with respect to FIG. 6. The multizone resonating structure 2000 including a radiating structure 210 and an inductive drive coil 2010 that are coupled by a low impedance common center capacitor 206 to the ground plane 202. In some embodiments, the capacitance of the common center capacitor 206 is in a range of 5 pF to 1000 pF. The outer resonating structure 502 and the inner resonating structure 504 may operate at different resonant frequencies despite sharing the common center capacitor 206. The ground plane 202 includes a central hole around the axis 510 through which a power feed 2012 and a ground or matching circuit 2014 couple to the inductive drive coil 2010.

The inductive drive coil 2010 may receive two frequencies through a single power feed 2012 and act as an excitation component to inductively couple with magnetic fields generated by the radiating structure 210. The inductive drive coil 2010 also inductively couples with and generates plasma 112.

The outer resonating structure 502 has a low impedance outer capacitor 206 and a low impedance inner capacitor 206 that is shared with the inner resonating structure 504. As such, the outer capacitor 206, the radiating structure 210, and the inner capacitor 206 form a floating resonance circuit.

In some embodiments, the capacitance of the outer capacitor 206 is in a range of 5 pF to 1000 pF.

In some embodiments, the radiating structure 210 includes eight arms disposed between an inner ring and an outer ring. The inner capacitor 206 is a low impedance center ring that is coupled to the radiating structure 210. The inner capacitor 206 has mutual coupling with the inductive drive coil 2010.

In some embodiments, inductive structures of the radiating structure 210 and the inductive drive coils 2010 are overlapping. In other embodiments, the radiating structures 210 couple to the plasma inductively, while the power coupling between the circuits for the radiating structures 210 and the circuits for the inductive drive coils 2010 may be separated (e.g., conductive offsets 208 are inductive couplings of the circuits for the radiating structures 210).

Figure 21:
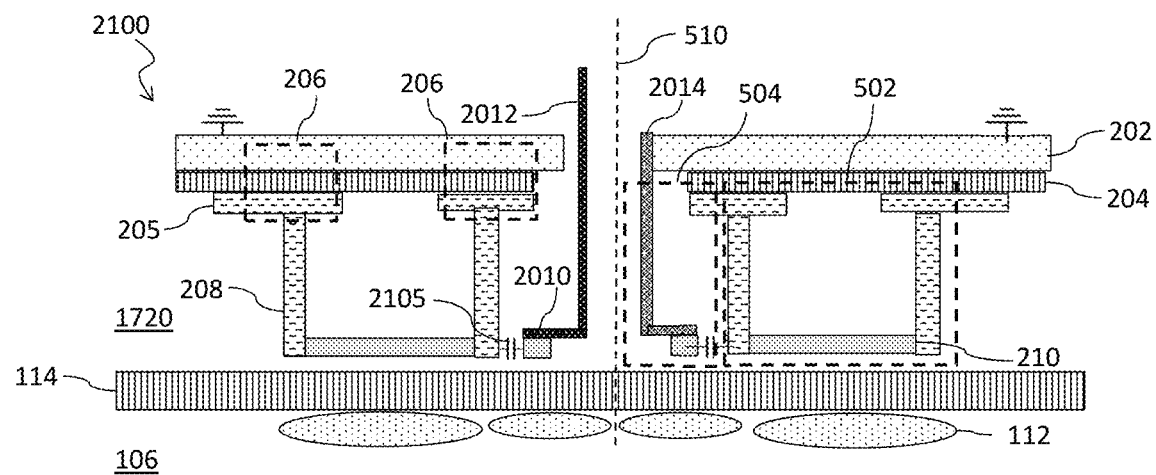

FIG. 21 illustrates a cross-sectional view of a multizone resonating structure 2100 that is a detailed example of inductive power coupling similar to the multizone resonating structure 2000 (see above, FIG. 20) with an additional capacitor 2105 between the radiating structure 210 and the inductive drive coil 2010.

In some embodiments, the radiating structure 210 includes four arms disposed between an inner ring and an outer ring. The capacitor 2105 between the radiating structure 210 and the inductive drive coil 2010 is formed by the inner ring of the radiating structure 210 and the loop of the inductive drive coil 2010, which couple capacitively across a gap filled with a dielectric. The dielectric may be atmosphere, air, ceramic, Teflon, the like, or a combination thereof. Teflon may maintain a more uniform spacing between the inner ring of the radiating structure 210 and the loop of the inductive drive coil 2010 and may reduce arc discharges between them. In some embodiments, the capacitor 1905 has a capacitance in a range of 1 pF to 100 pF.

In some embodiments, in place of the capacitor 2105, inductive coupling is used between a common conductive structure of the radiating structure 210 (e.g., a conductive center ring or portion of the radiating structure 210) and the inductive drive coil 2010 based on the current direction at a given frequency. This inductive coupling between the common conductive structure of the radiating structure 210 and the inductive drive coil 2010 is a different inductive coupling method from an inductive coupling between an inductive drive coil and arms of the radiating structure 210.

Figure 22A:
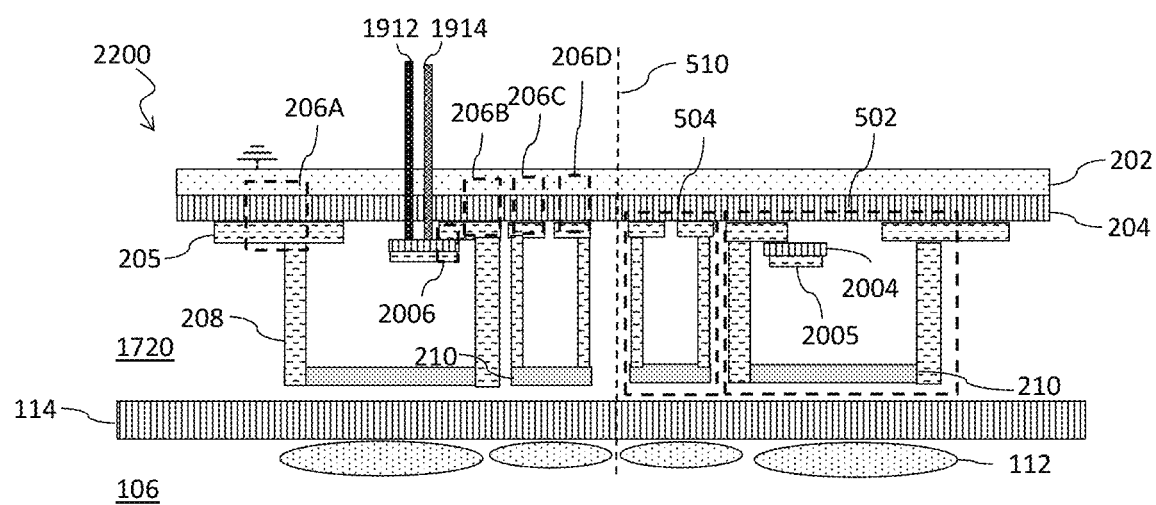

FIG. 22A illustrates a cross-sectional view of a multizone resonating structure 2200 that is a detailed example of capacitive power coupling in an embodiment of the multizone resonating structure 700 described above with respect to FIG. 11. An excitation component using capacitive power coupling includes a capacitor 2006 formed by a conductive plate 2005, a dielectric structure 2004, and the ground plane 202. In the example illustrated by FIG. 22A, the capacitor 2006 is on the inner edge of the outer resonating structure 502, closer to the axis 510. However, the capacitor 2006 may also be on the outer edge of the outer resonating structure 502, farther from the axis 510, or in any other suitable position.

In some embodiments, the outer resonating structure 502 and the inner resonating structure 504 are each a floating resonance circuit zone including a respective outer capacitor 206, a respective radiating structure 210, and a respective inner capacitor 206.

The capacitive coupling drives the radiating structures 210 by capacitive coupling between the capacitor 2006 and the radiating structure 210 of the outer resonating structure 502. The capacitor 2006 is coupled to a power feed 1912 and a ground or matching circuit 1914 in order to drive the capacitor 2006 with a single or multiple frequencies. In some embodiments, one or more variable frequencies are provided to the capacitor 2006. In some embodiments, the capacitors 206 of the outer resonating structure 502 also capacitively couple to the radiating structure 210 of the inner resonating structure 504.

In some embodiments, an additional power feed and matching circuit are coupled to the capacitors 206 of the inner resonating structure 504 in order to use a single frequency drive to tune the resonant frequency of the inner resonating structure 504. The matching circuit may include one or more tuning elements such as capacitors or inductors (either fixed or variable). This may enable adjusting the relative amounts of power that are provided through the capacitive coupling of the capacitor 2006 to the radiating structure 210 of the outer resonating structure 502 and the radiating structure 210 of the inner resonating structure 504. In some embodiments, a third zone (e.g., an additional resonating structure 508; see above, FIGS. 5E-5G) is present with another respective power feed and matching circuit coupled to a respective capacitor of the third zone in order to use a single frequency drive to tune the resonant frequency of the third zone.

The radiating structure 210 of the inner resonating structure 504 is driven by mutual inductive coupling with the radiating structure 210 of the outer resonating structure 502. The respective radiating structures 210 are placed in close enough proximity (e.g., separated by a distance in a range of 5 mm to 100 mm to enable strong mutual inductive coupling. In other embodiments, the outer resonating structure 502 and the inner resonating structure 504 can overlap, which provides inductive coupling between them while the area of plasma coupling can be reduced by the respective radiating structures 210 being separated by a distance greater than 20 mm. In some embodiments, the mutual inductive coupling occurs at a resonant frequency of the inner resonating structure 504 and ignites plasma 112 under the radiating structure 210 of the inner resonating structure 504. In some embodiments, the mutual inductive coupling occurs at a resonant frequency of the outer resonating structure 502 and ignites plasma 112 under the radiating structure 210 of the outer resonating structure 502.

In some embodiments, the mutual inductive coupling occurs at a shared resonant frequency of the outer resonating structure 502 and the inner resonating structure 504 and ignites plasma 112 under the respective radiating structures 210 of both of the outer resonating structure 502 and the inner resonating structure 504. A matching circuit may be coupled to one or both of the outer resonating structure 502 and the inner resonating structure 504 to maintain resonance of that resonating structure by tuning its resonant frequency as the density of the plasma 112 changes. The matching circuit may track the resonating structure using harmonic sensing, such as with inductive coil sensors in both the respective power feed and matching circuit feed.

Figure 22B:
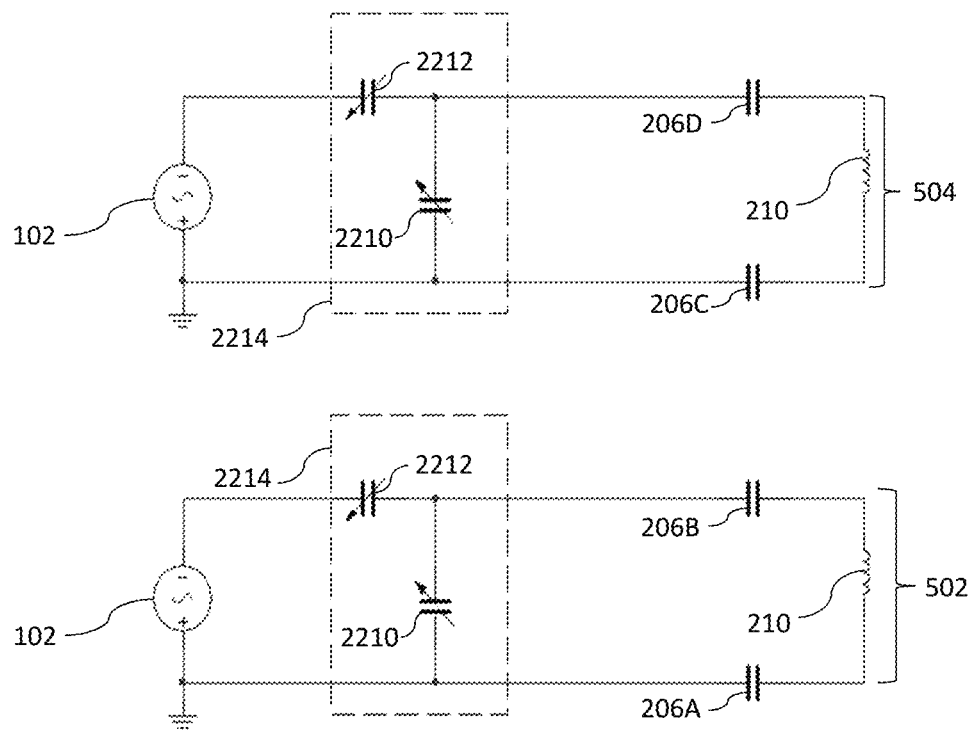
FIGS. 22B-22D are schematics of example matching circuits coupled to embodiment resonating structures.
Figure 22C:
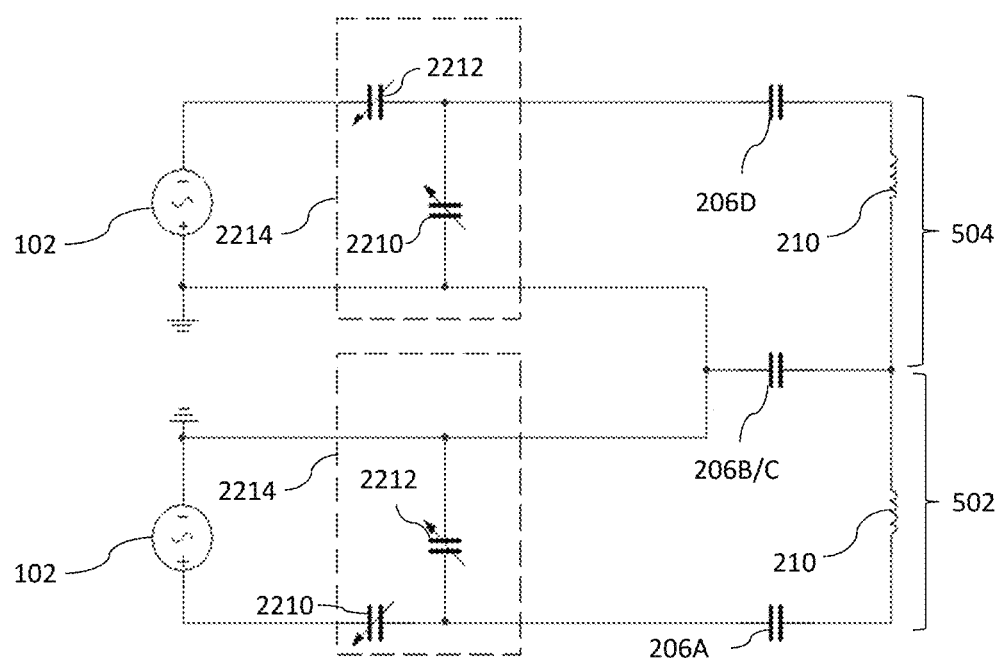

FIGS. 22B and 22C illustrate example schematics of two matching circuits 2214 that couple resonating structures to respective RF sources 102. Each matching circuit 2214 includes a variable capacitor 2210 coupled in parallel with each of the outer resonating structure 502 and the inner resonating structure 504 and a variable capacitor 2212 coupled between a respective variable capacitor 2210 and a respective RF source 102. FIG. 22B illustrates an example in which the outer resonating structure 502 is coupled to a respective matching circuit 2214 through a capacitor 206A and a capacitor 206B and the inner resonating structure 504 is coupled to a respective matching circuit 2214 through a capacitor 206C and a capacitor 206D. FIG. 20C illustrates an example in which the outer resonating structure 502 is coupled to a respective matching circuit 2214 through a capacitor 206A, the inner resonating structure 504 is coupled to a respective matching circuit 2214 through a capacitor 206D, and a common capacitor 206B/C of the outer resonating structure 502 and the inner resonating structure is coupled to both of the matching circuits 2214.

In some embodiments, the mutual inductive coupling includes using two frequencies that are superimposed through the outer resonating structure 502 and the inner resonating structure 504 at the same time or pulsed and adjusted to maintain resonance control and balance of each of the outer resonating structure 502 and the inner resonating structure 504. For example, the two frequencies may be supplied though the capacitor 2006 (see above, FIG. 22A) using a multi-tone drive. It should be noted that multiple frequencies can be provided with a multiple frequency generator having one RF source 102, in accordance with FIG. 15 and FIG. 16 above. In some embodiments, separate matching elements such as variable capacitor 2210 and variable capacitor 2212 are included in various configurations.

Figure 22D:
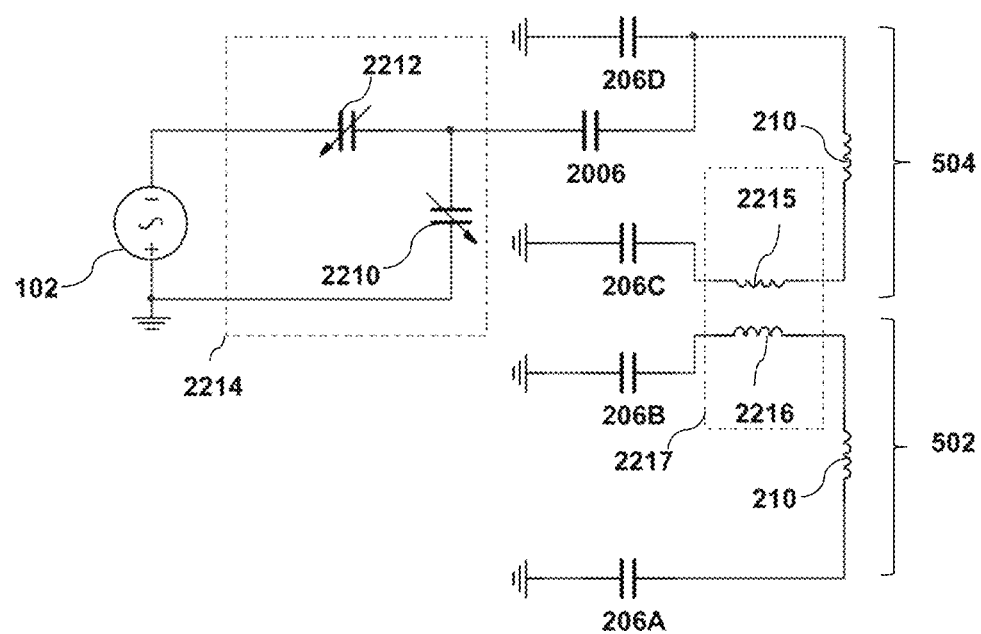

In some embodiments, the capacitor 2006 (see above, FIG. 22A) is formed by a conductive plate 2005 and a dielectric structure 2004 in the inner resonating structure 504, so that the capacitor capacitively couples to the radiating structure 210 of the inner resonating structure 504 rather than the radiating structure 210 of the outer resonating structure 502. FIG. 22D illustrates the radiating structure 210 of the outer resonating structure 502 driven by a mutual inductive coupling structure 2217. The mutual inductive coupling structure 2217 includes one or more inductor(s) 2215 coupled to the radiating structure 210 of the inner resonating structure 504 and one or more inductor(s) 2216 coupled to the radiating structure 210 of the outer resonating structure 502. The inductor(s) 2215 are mutually coupled with the inductor(s) 2216. The outer resonating structure 502 may include a tuning structure (e.g., a capacitor or inductor coupled to a power feed and matching circuit) to match the resonant frequency of the inner resonating structure 504.

Figure 23:
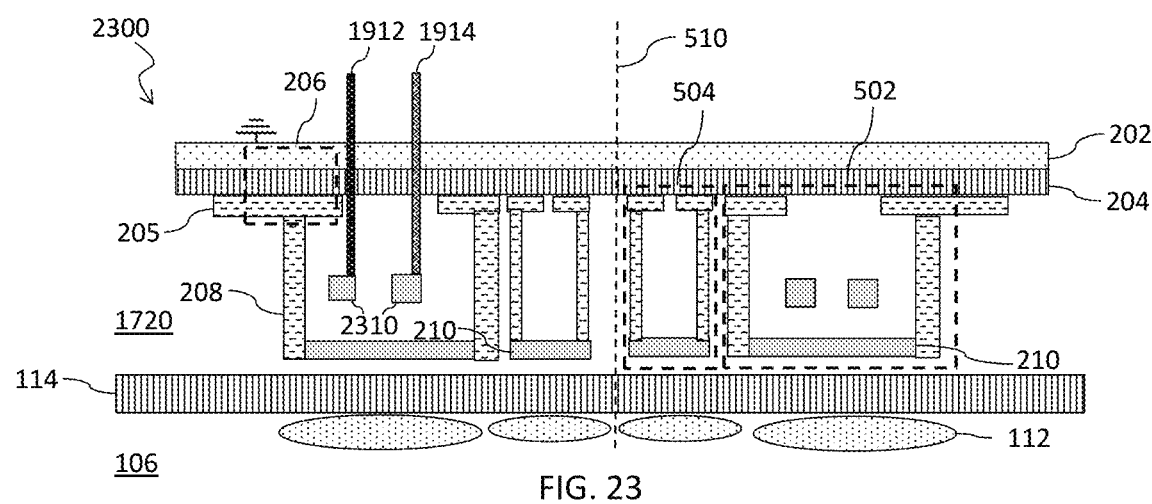
FIGS. 23 and 24A are cross-sectional views of detailed examples of embodiment resonating structures.

FIG. 23 illustrates a cross-sectional view of a multizone resonating structure 2100 that is a detailed example of inductive power coupling in an embodiment of the multizone resonating structure 700 described above with respect to FIG. 7. An inductive drive coil 2310 is in the outer resonating structure 502. The inductive drive coil 2310 may be isolated from plasma generation by being separated from the plasma chamber 106 by a distance in a range of 10 mm to 100 mm. As the thickness of the dielectric plate 114 may be needed to support a vacuum in the plasma chamber 106, a separation distance of about 10 mm may be achieved with, e.g., a bell shape of the dielectric plate 114 and plasma chamber 106. In some embodiments, the separation distance is variable, using mechanical actuators to adjust the relative height of the inductive drive coil 2310. The inductive drive coil 2310 acts as an excitation component to inductively couple with the radiating structure 210 of the outer resonating structure 502.

The inductive drive coil 2310 may have multiple coils arranged vertically or horizontally. In embodiments in accordance with FIG. 23, the inductive drive coil 2310 is a two turn coil with the coils arranged horizontally. In other embodiments, the inductive drive coil 2310 is a two turn coil with the coils stacked vertically. However, the inductive drive coil 2310 can be in any shape that couples to the respective radiating structure 210. For example, the inductive drive components may be arcs or line segments that match the patterns of the respective radiating structure(s) 210 rather than coils. In some embodiments, the inductive drive coil 2310 is a pair of half coils that cover 180° each of the azimuthal plane, with each respective half coil having its own respective power feed and ground or matching circuit coupling.

The inductive drive coil 2310 is coupled to a respective power feed 1912 and a respective ground or matching circuit 1914. The inductive drive coil 2310 may receive single or variable frequencies through the respective power feeds 1912.

The radiating structure 210 of the inner resonating structure 504 is driven by inductive coupling with the inductive drive coil 2310, which produces a magnetic field that couples to the outer resonating structure 502 and the inner resonating structure 504. The radiating structure 210 may be further driven by mutual inductive coupling with the radiating structure 210 of the outer resonating structure 502. The mutual inductive coupling in the multizone resonating structure 2300 may be similar to the mutual inductive coupling in the multizone resonating structure 2200 described above with respect to FIG. 22A, and the details are not repeated herein. The mutual inductive coupling between the radiating structure 210 of the inner resonating structure 504 and the radiating structure 210 of the outer resonating structure 502 may further include pulse modulation between different frequencies supplied by the inductive drive coil 2310.

Although not illustrated, the multizone resonating structure 2300 may include tuning elements (e.g., additional capacitors or inductors that may be variable) coupled to either or both of the outer resonating structure 502 or the inner resonating structure 504. The tuning elements may allow the respective resonant frequencies of the resonant structures to be tuned.

In some embodiments, the radiating structure 210 of the outer resonating structure 502 includes eight arms disposed between an inner capacitor 206 and an outer capacitor 206 of the outer resonating structure 502. The inner capacitor 206 may be a low impedance center ring that is coupled to the radiating structure 210 and has mutual coupling with the inductive drive coil 2310.

In some embodiments, the inductive drive coil 2310 is in the inner resonating structure 504 rather than the outer resonating structure 502 so that the inductive drive coil 2310 inductively couples to the radiating structure 210 of the inner resonating structure 504 more strongly than to the radiating structure 210 of the outer resonating structure 502. The radiating structure 210 of the outer resonating structure 502 is driven by inductive coupling with the inductive drive coil 2310 and mutual inductive coupling with the radiating structure 210 of the inner resonating structure 504. Additionally, there is mutual inductive coupling between the inner resonating structure 504 and the outer resonating structure 502.

In some embodiments, a shield separates the outer resonating structure 502 and the inner resonating structure 504. The shield may be a cylindrical sheet of conductive material, as described above with respect to FIG. 9. In some embodiments, the shield replaces an inner ring of conductive offsets 208 of the outer resonating structure 502. The shield may be a floating part of a CLC circuit. For example, the shield may couple a capacitor 206 to a radiating structure 210 (see above, FIG. 3B).

Figure 24A:
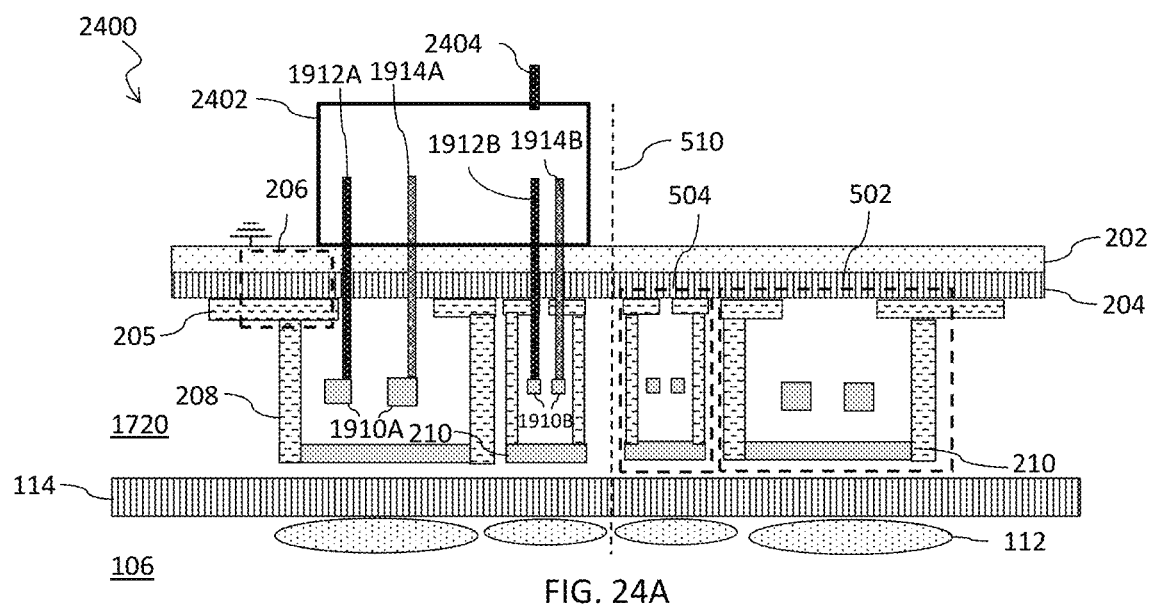

FIG. 24A illustrates a cross-sectional view of a multizone resonating structure 2400 that is similar to the multizone resonating structure 1900 described above with respect to FIG. 19 with the addition of an RF splitter 2402, which may also be referred to as a match box. A single RF power input 2404 provides power to the RF splitter 2402, such as from an RF source 102 (see above, FIG. 1). The RF splitter 2402 divides the power among two or more power feeds, such as power feed 1912A and power feed 1912B, each of which may receive single or variable frequencies and provide them to an inductive drive coil 1910A in the outer resonating structure 502 and an inductive drive coil 1910B in the inner resonating structure 502. Balance control for the power feeds 1912A and 1912B may be provided by matching circuits 1914A and 1914B in the RF splitter 2402, which may include LC circuits. As such, division of power between the outer resonating structure 502 and the inner resonating structure 504 may be performed through variable circuit elements in the RF splitter 2402, through a superimposing of interleaved pulsing of two frequencies with elements in the RF splitter 2402 that couple each frequency preferentially with either the outer resonating structure 502 or the inner resonating structure 504, or through a combination thereof.

Figure 24B:
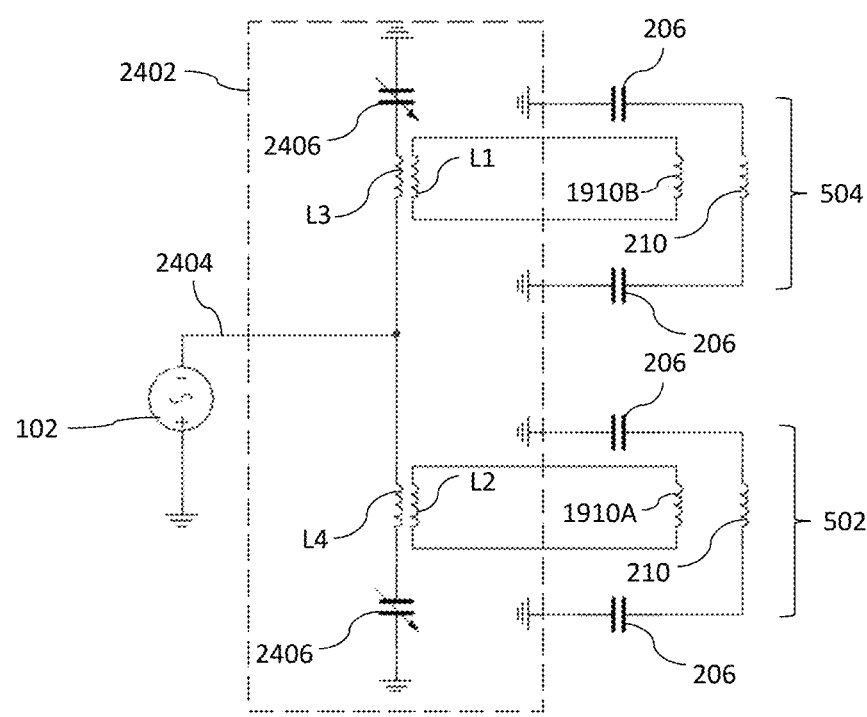
FIG. 24B is a schematic of an RF splitter.

FIG. 24B illustrates an example schematic of an RF splitter 2402 that is an inductive power splitter. The inductive drive coil 1910A of the outer resonating structure 502 is coupled to an inductor L1 and the inductive drive coil 1910B of the inner resonating structure 504 is coupled to an inductor L2. The inductor L1 is inductively coupled to an inductor L3 and the inductor L2 is inductively coupled to an inductor L4. The inductor L3 is coupled to the RF source 102 on one end and is coupled to ground across a capacitor 2406 on the other end. The inductor L4 is coupled to the RF source 102 on one end and is coupled to ground across a capacitor 2406 on the other end. The inductors L3 and L4 may share a node that is coupled to the RF source 102. The capacitors 2406 may be variable.

The inductive power coupling illustrated in FIGS. 24A-24B is advantageous because the inductive coupling of the inductor L1 to the inductive drive coil 1910A and the inductor L2 to the inductive drive coil 1710B allows the inductive power drives to float and reduces the non-symmetric influence of a coil that is grounded on one end. This may reduce undesirably high voltage than can form on the drive coil and thus reduce the capacitive coupling to the plasma 112 when the inductive drive coils 1910 are near the dielectric plate 114. The floating inductive power coupling may maintain an even current in the cavity and even voltages to achieve uniformity. The power coupling may also be varied by controlling the ratios of the inductance of the various inductive components with respect to each other (e.g., the ratio of the inductances of the inductor L1 to the inductive drive coil 1910A or the inductor L3 to the inductor L1). It should be appreciated that the inductive power coupling illustrated in FIGS. 24A-24B is a non-limiting example of a power splitting scheme, and any suitable power splitting scheme may be used.

Figure 25:
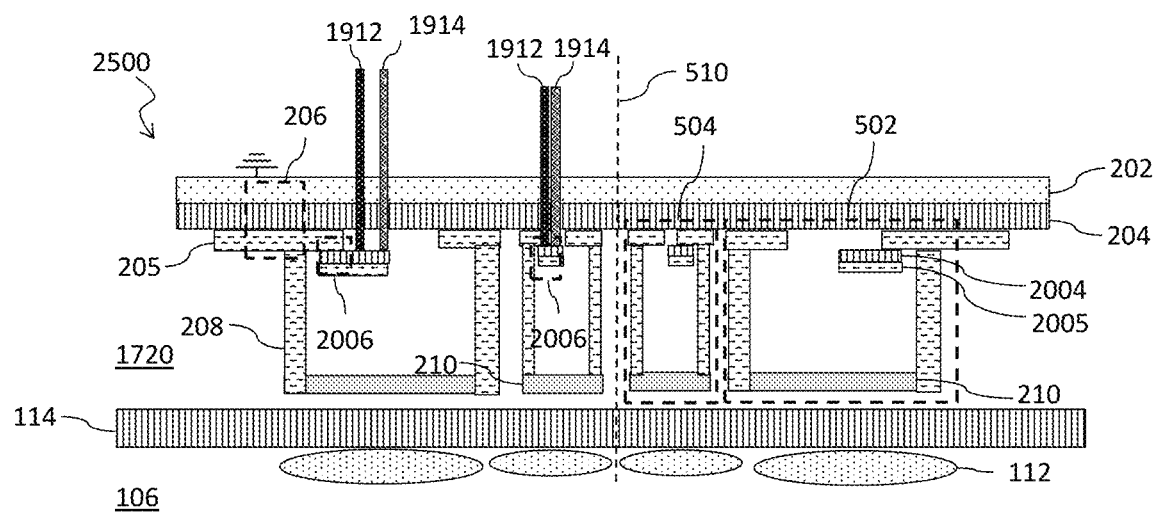
FIGS. 25-28 are cross-sectional views of detailed examples of embodiment resonating structures.

FIG. 25 illustrates a cross-sectional view of a multizone resonating structure 2500 that is a detailed example of capacitive power coupling in an embodiment of the multizone resonating structure 800 described above with respect to FIG. 8. Excitation components using capacitive power coupling are present in each of the outer resonating structure 502 and the inner resonating structure 504. The excitation components include respective capacitors 2006 formed by respective conductive plates 2005, respective dielectric structures 2004, and the ground plane 202.

In the example illustrated by FIG. 25, the capacitors 2006 are on respective outer edges of the outer resonating structure 502 and the inner resonating structure 504, closer to the axis 510. However, either or both of the capacitors 2006 may also be on respective inner edges of the outer resonating structure 502 and the inner resonating structure 504, closer to the axis 510, or in any other suitable position.

The capacitive coupling drives the radiating structures 210 by capacitive coupling between the capacitors 2006 and the respective radiating structures 210 of the outer resonating structure 502 and the inner resonating structure 504. The capacitors 2006 are coupled to respective power feeds 1912 and ground or matching circuits 1914 in order to drive the capacitors 2006 with a single or multiple frequencies. In some embodiments, one or more variable frequencies are provided to the capacitors 2006. In some embodiments, the power feeds 1912 are coupled to a single power source (e.g., an RF source 102; see above, FIG. 1) through a power splitter.

In some embodiments, the capacitors 206 of the outer resonating structure 502 or the inner resonating structure 504 are coupled to matching circuits including tuning elements (e.g., inductors or capacitors that may be variable or fixed). The tuning elements may be used to tune the respective resonant frequencies of the outer resonating structure 502 and the inner resonating structure 504, which may be advantageous for controlling the mutual inductive coupling between the respective radiating structures 210 of the outer resonating structure 502 or the inner resonating structure 504. For example, in order to reduce mutual inductive coupling between the radiating structures 210, it may be advantageous to supply power with different frequencies to the outer resonating structure 502 and the inner resonating structure 504 through their respective capacitors 2006 or capacitors 206.

In some embodiments, the conductive plates 2005 are separate conductive rings in each of the outer resonating structure 502 and the inner resonating structure 504. However, the conductive plates 2005 may have any suitable shape or arrangement.

Figure 26:
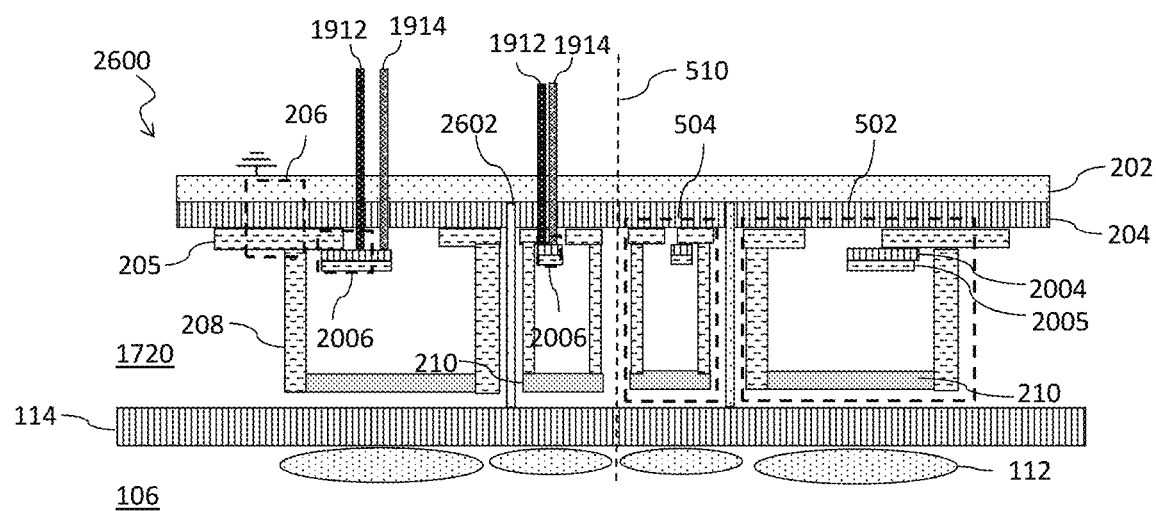
Figure 27:
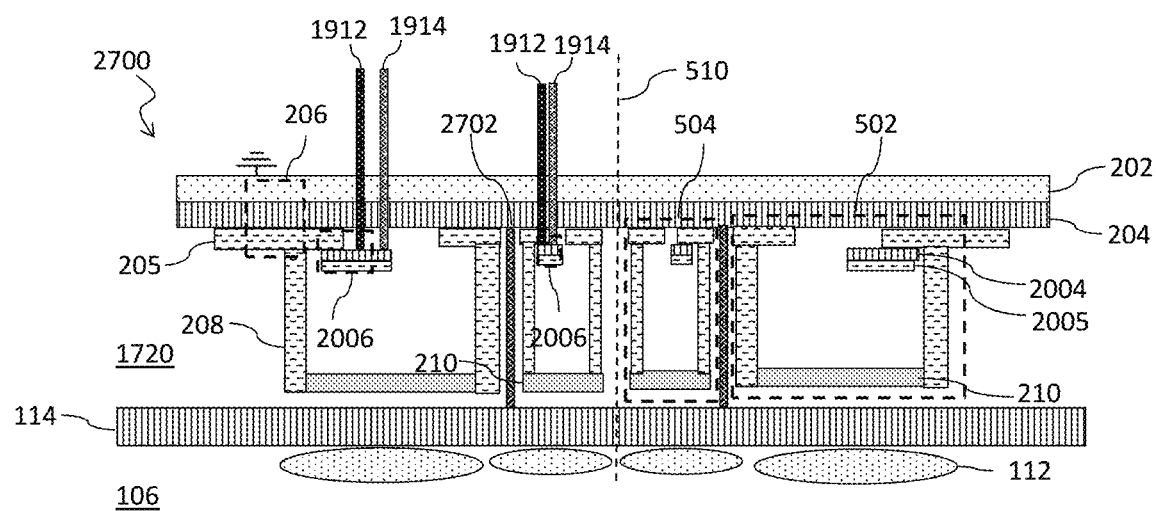
Figure 28:
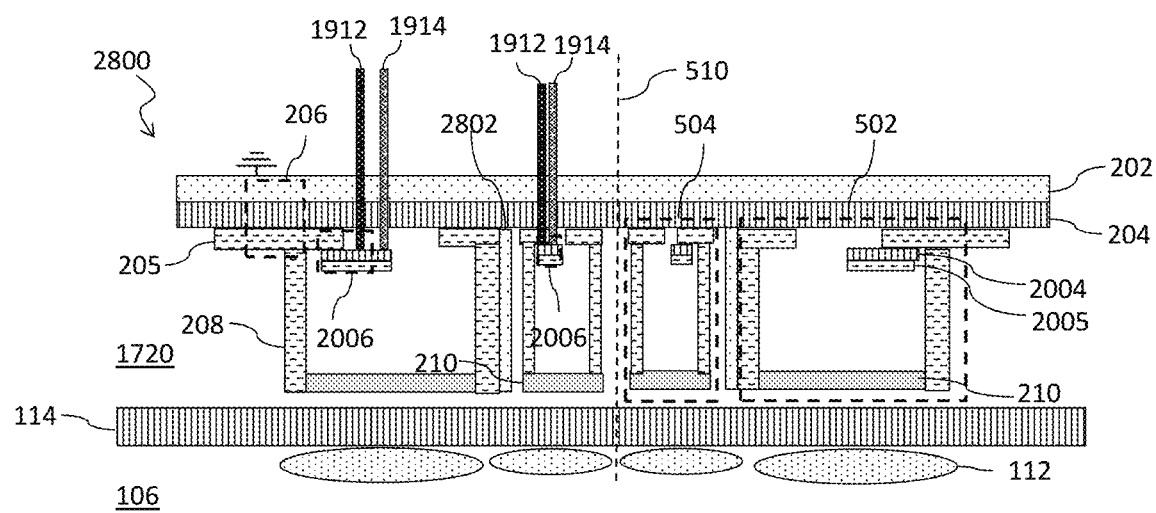

FIGS. 26, 27, and 28 illustrates cross-sectional views of a multizone resonating structure 2600, a multizone resonating structure 2700, and a multizone resonating structure 2800, respectively, which are additional detailed examples of capacitive power coupling in embodiments of the multizone resonating structure 900 described above with respect to FIG. 9. The multizone resonating structure 2600, the multizone resonating structure 2700, and the multizone resonating structure 2800 are similar to the multizone resonating structure 2500 (see above, FIG. 25) with the addition of respective shields separating the outer resonating structure 502 and the inner resonating structure 504. The shields may be cylindrical sheets of conductive material, as described above with respect to FIG. 9.

As shown in FIG. 26, the respective shield 2602 of the multizone resonating structure 2600 is grounded between the outer resonating structure 502 and the inner resonating structure 504. For example, the shield 2602 may be coupled to the ground plane 202, such as by conductive supports or direct bonding.

As shown in FIG. 27, the respective shield 2702 of the multizone resonating structure 2700 is floating between the outer resonating structure 502 and the inner resonating structure 504. For example, the shield 2702 may be supported by dielectric supports coupled to the insulating structure 204.

As shown in FIG. 28, the respective shield 2802 of the multizone resonating structure 2800 is coupled to the conductive offsets 208 of the outer resonating structure 502. In some embodiments, the shield 2802 replaces an inner ring of conductive offsets 208 of the outer resonating structure 502. The shield 2802 may be a floating part of a CLC circuit. For example, the shield 2802 may couple a capacitor 206 to a radiating structure 210 (see above, FIG. 3B).

Example embodiments of the disclosure are summarized here. Other embodiments can also be understood from the entirety of the specification as well as the claims filed herein.

Example 1. An apparatus for plasma processing, the apparatus including: a first resonating structure, the first resonating structure being coupled to a first RF generator through a first matching circuit; and a second resonating structure surrounding the first resonating structure, the second resonating structure being coupled to a second RF generator through a second matching circuit.

Example 2. The apparatus of example 1, where the first RF generator and the second RF generator are the same RF generator.

Example 3. The apparatus of one of examples 1 or 2, where the first resonating structure has a cylindrical shape.

Example 4. The apparatus of one of examples 1 to 3, further including a third resonating structure surrounding the second resonating structure.

Example 5. The apparatus of one of examples 1 to 4, where the first resonating structure is coupled to a ground plane through a first capacitor and the second resonating structure is coupled to the ground plane through a second capacitor.

Example 6. The apparatus of example 5, where the first capacitor and the second capacitor are the same.

Example 7. The apparatus of one of examples 1 to 6, further including a shield between the first resonating structure and the second resonating structure.

Example 8. The apparatus of example 7, where the shield is grounded.

Example 9. The apparatus of example 7, where the shield is a floating part of a CLC circuit.

Example 10. An apparatus for plasma processing, the apparatus including: a first resonating structure, the first resonating structure creating a first zone for a first plasma influenced by the first resonating structure; and a second resonating structure, the second resonating structure creating a second zone for a second plasma influenced by the second resonating structure, where the second zone surrounds the first zone.

Example 11. The apparatus of example 10, where the second resonating structure is driven by a first frequency through a first inductive coil, the first inductive coil being in the second resonating structure.

Example 12. The apparatus of example 11, where a radiating structure of the first resonating structure is driven by coupling with a radiating structure of the second resonating structure.

Example 13. The apparatus of one of examples 11 or 12, where the first resonating structure is driven by a second frequency through the first inductive coil.

Example 14. The apparatus of example 13, where the first frequency and the second frequency are supplied concurrently.

Example 15. The apparatus of example 14, where the first frequency and the second frequency are supplied as interleaved pulses.

Example 16. The apparatus of one of examples 11 to 15, where the first inductive coil is floating.

Example 17. The apparatus of example 11, where the first resonating structure is driven by a second frequency through a second inductive coil, the second inductive coil being in the first resonating structure, the first inductive coil and the second inductive coil being coupled to an RF power source through an RF splitter.

Example 18. The apparatus of example 17, where respective powers supplied to the first inductive coil and the second inductive coil are configurable by varying inductances or capacitances of variable components of the RF splitter.

Example 19. An apparatus for plasma processing, the apparatus including: a first cavity having a first resonant frequency, the first cavity being coupled through a first capacitor to a conductive plane; and a second cavity having a second resonant frequency, the second cavity being surrounded by the first cavity, the second cavity being coupled through a second capacitor to the conductive plane.

Example 20. The apparatus of example 19, where the first resonant frequency is the same as the second resonant frequency.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure. It should be appreciated that the physical arrangement and disposition of the components in the various embodiments of, for example, the plasma processing system or the resonating structures are non-limiting. For example, although the resonating structure is arranged between the RF source and the plasma processing system in the various illustrations, this arrangement is non-limiting, and these components may be arranged adjacent, above, or below the other components while within the scope of the present disclosure.

What is claimed is:

1. An apparatus for plasma processing, the apparatus comprising:
 a first resonating structure, the first resonating structure being coupled to a first RF generator through a first matching circuit; and
 a second resonating structure surrounding the first resonating structure, the second resonating structure being coupled to a second RF generator through a second matching circuit.

2. The apparatus of claim 1, wherein the first RF generator and the second RF generator are a same RF generator.

3. The apparatus of claim 1, wherein the first resonating structure has a cylindrical shape.

4. The apparatus of claim 1, further comprising a third resonating structure surrounding the second resonating structure.

5. The apparatus of claim 1, wherein the first resonating structure is coupled to a ground plane through a first capacitor and the second resonating structure is coupled to the ground plane through a second capacitor.

6. The apparatus of claim 5, wherein the first capacitor and the second capacitor are the same.

7. The apparatus of claim 1, further comprising a shield between the first resonating structure and the second resonating structure.

8. The apparatus of claim 7, wherein the shield is grounded.

9. The apparatus of claim 7, wherein the shield is a floating part of a CLC circuit.

10. An apparatus for plasma processing, the apparatus comprising:
    a first resonating structure, the first resonating structure creating a first zone for a first plasma influenced by the first resonating structure; and
    a second resonating structure, the second resonating structure creating a second zone for a second plasma influenced by the second resonating structure, wherein the second zone surrounds the first zone.

11. The apparatus of claim 10, wherein the second resonating structure is driven by a first frequency through a first inductive coil, the first inductive coil being in the second resonating structure.

12. The apparatus of claim 11, wherein a radiating structure of the first resonating structure is driven by coupling with a radiating structure of the second resonating structure.

13. The apparatus of claim 11, wherein the first resonating structure is driven by a second frequency through the first inductive coil.

14. The apparatus of claim 13, wherein the first frequency and the second frequency are supplied concurrently.

15. The apparatus of claim 14, wherein the first frequency and the second frequency are supplied as interleaved pulses.

16. The apparatus of claim 11, wherein the first inductive coil is floating.

17. The apparatus of claim 11, wherein the first resonating structure is driven by a second frequency through a second inductive coil, the second inductive coil being in the first resonating structure, the first inductive coil and the second inductive coil being coupled to an RF power source through an RF splitter.

18. The apparatus of claim 17, wherein respective powers supplied to the first inductive coil and the second inductive coil are configurable by varying inductances or capacitances of variable components of the RF splitter.

19. An apparatus for plasma processing, the apparatus comprising:
    a first cavity having a first resonant frequency, the first cavity being coupled through a first capacitor to a conductive plane; and
    a second cavity having a second resonant frequency, the second cavity being surrounded by the first cavity, the second cavity being coupled through a second capacitor to the conductive plane.

20. The apparatus of claim 19, wherein the first resonant frequency is the same as the second resonant frequency.

* * * * *